United States Patent [19]
Ohmaye et al.

[11] Patent Number: 5,544,305
[45] Date of Patent: Aug. 6, 1996

[54] SYSTEM AND METHOD FOR CREATING AND EXECUTING INTERACTIVE INTERPERSONAL COMPUTER SIMULATIONS

[75] Inventors: Enio Ohmaye, Sunnyvale; Arthur James, San Jose, both of Calif.

[73] Assignee: Apple Computer, Inc., Cupertino, Calif.

[21] Appl. No.: 187,681

[22] Filed: Jan. 25, 1994

[51] Int. Cl.$^6$ .................................................. C06F 15/00
[52] U.S. Cl. ........................ 395/161; 395/155; 395/154
[58] Field of Search .................................. 395/155–161, 395/152, 154, 500; 345/117–120, 122; 434/118

[56] References Cited

U.S. PATENT DOCUMENTS

| | | | |
|---|---|---|---|
| 5,093,907 | 3/1992 | Hwong et al. | 395/152 |
| 5,111,409 | 5/1992 | Gasper et al. | 395/161 X |
| 5,287,448 | 2/1994 | Nicol et al. | 395/159 |
| 5,307,456 | 4/1994 | MacKay | 395/155 |
| 5,310,349 | 5/1994 | Daniels et al. | 434/118 X |
| 5,363,482 | 11/1994 | Victor et al. | 395/157 |
| 5,377,319 | 12/1994 | Kitahara et al. | 395/161 |
| 5,388,993 | 2/1995 | McKiel et al. | 434/118 |
| 5,395,243 | 3/1995 | Lubin et al. | 434/118 |

FOREIGN PATENT DOCUMENTS

| | | | |
|---|---|---|---|
| 0483991 | 10/1991 | European Pat. Off. | G06F 9/34 |
| 0513553 | 4/1992 | European Pat. Off. | G06F 9/44 |

OTHER PUBLICATIONS

Language Development & Hypermedia Research Group "'Open' Software Design: A Case Study", Educational Technology, vol. XXXII, No. 2, Feb., 1992, pp. 43–55.

Language Development and Hypermedia Research Group, "Bubble Dialog: A New Tool for Instruction and Assessment," Educational Technology Research and Development vol. 40,. No. 2, 1992, pp. 59–67.

Action! User Guide, Macromedia and Apple, 1992.

"Balloon Windows for Supplementary Dialogues and Information", IBM Tech. Discl. Bull., Mar., 1991, pp. 263–265.

Authorware Professional Tutorial, Macromedia and Apple, 1992, pp. 1–62.

Chang, "Visual Languages: A Tutorial and Survey", IEEE, Jan., 1987, pp. 29–39.

Enio Ohmaye, Simulation–Based Language Learning: An Architecture And Multimedia Authoring Tool, Jun., 1992, pp. 1–171.

*Primary Examiner*—Mark R. Powell
*Assistant Examiner*—John E. Breene
*Attorney, Agent, or Firm*—Greg T. Sueoka

[57] ABSTRACT

A system and method for creating and executing interactive interpersonal computer simulations comprises an authoring editor. The authoring editor presents an authoring user interface with a comic book metaphor form for the creation of simulations. The authoring editor also provides constructs that represent chapter objects, cell objects, character objects, message objects, and thought objects to create a simulation. The authoring editor interprets the constructs and their arrangement and creates an executable simulation stored in an active simulation memory. The system also includes an engine that reads the active simulation memory, recognizes the data objects, and executes subroutines corresponding to the data objects. The engine outputs the results of the execution of the objects to the user through a simulation user interface.

30 Claims, 14 Drawing Sheets

SYSTEM AND METHOD FOR CREATING AND EXECUTING INTERACTIVE INTERPERSONAL COMPUTER SIMULATIONS

BACKGROUND OF THE INVENTION

1. Field of the Invention

The present invention relates generally to computer systems, and in particular, to computer systems for creating simulations of interpersonal relationships and interactions.

2. Description of the Related Art

Computer simulations ("simulations") are powerful tools for modeling different processes and situations. Simulations can model situations and anticipate events that are likely to occur in a process. Simulations can also realistically model personal interactions in a variety of different situations. For these reasons, computer simulations are useful tools for teaching individuals the appropriate behavior for new situations they are likely to encounter. By way of example, an interactive computer simulation can be very useful in preparing a person for the interpersonal contact that will be encountered when traveling in a foreign country, such as proceeding through customs and arranging for transportation and hotel accommodations.

There are a variety of computer simulation systems that currently exist in the art. Currently, computer simulation systems include, among other things, the interaction of language synthesizers, language models, inference engines, large data bases, language and speech recognition systems, and video and audio output. All these devices and systems, and many others, must be specifically designed, connected, and managed by highly skilled programmers and technicians in order to create and maintain a simulation.

In order to create new simulations for existing computer simulation systems, the creator/author must typically be very knowledgeable about computer organization, programming, and operation generally, as well as the specific language and operation of the particular simulation system. Therefore, the persons able to create simulations are severely restricted to a highly technical group of users that may have little or no knowledge of the human interactions or situations that are being simulated. Thus, there is a need for an interpersonal computer simulation system in which it is simple for users to create simulations.

Yet another problem with existing interpersonal computer simulation systems is that acceptable grammars for input and output can quickly become very complicated and difficult for even highly skilled programmers to update and correct. Therefore, there is a need for a system of displaying grammars to the user that is easy to understand and to modify.

A further problem with prior art simulation systems is that they do not allow the person creating the simulations to switch between a mode in which the simulation is being written, and a mode in which the simulation is being run. This makes the process of creating and testing new simulations very time consuming and difficult. Therefore, there is a need for a computer simulation system that readily allows the user to create simulations, even partially, and then test the created simulations by executing them.

A final problem with interpersonal computer simulations is that they do not provide a mechanism for creating and adding corrective advice, pointers, or hints into the simulation. Since the simulations are interactive, it is often useful to provide the user/operator with hints or suggestions on the proper response when a response or input in a simulation indicates that the user is having difficulty proceeding through the simulation as intended by the author of the simulation. In most prior art systems, any such corrective hints or advice must be programmed directly into the simulation. Such direct programming can be very time consuming and only performed by those familiar with the system. Moreover, it is even more difficult to modify the hints or suggestions when they are presented after their initial creation. Thus, there is a need for a system that allows the author to concurrently create the simulation as well as any corrective advice or hints that may be desired.

Therefore, there is a need for a system and methods in which simulations are easier to create and that provide much more flexibility during simulation creation.

SUMMARY OF THE INVENTION

The present invention is a system and methods for creating and executing interpersonal computer simulations. The system of the present invention comprises an output device, a central processing unit, an input device, a memory means, a CD-ROM drive, and a data storage device. The memory means advantageously includes an authoring editor, an active simulation, an engine, an authoring user interface, and a simulation user interface. These components are preferably coupled together by a bus and configured for multimedia presentation. The input device is capable of inputting text, video, and audio data. The output device is capable of outputting high fidelity audio and high resolution video, as well as text and other display output.

The present invention advantageously provides a comic book interface for creating simulations. The authoring editor displays an authoring user interface including chapter icons, cell icons, and strip icons for organizing the simulation. The simulation itself is represented by character objects, message bubble objects, and thought bubble objects. The character objects represent the people in the simulation. Message bubble objects and thought bubble objects represent statements by the character objects and changes to states of mind, respectively. The authoring user interface also includes prop objects, run time prop objects, and scroll objects for directing the course of the simulation. The chapter objects are the highest level of organization in the simulation. The author uses cell objects to create scenes and places character objects within the cell objects, using a drag and drop method, to create an interaction between character objects. The authoring editor displays the simulation in the authoring user interface, as the simulation objects will be executed, from left to right and from top to bottom. Consistent with the comic book metaphor, speech bubbled and thought bubbles may be bound to each character.

The present invention includes a method for creating interactive computer simulations where the author merely arranges these constructs and enters simple text as if writing a story for a comic book using the authoring user interface. The processor under the control of the authoring editor automatically translates the constructs and text into a simulation stored in the active simulation memory. The authoring editor handles the technical computer programming for the author by organizing and linking the hierarchy of organizational constructs and by organizing and linking the character objects, message bubble objects, thought bubble objects, prop objects, run time prop objects, and scroll objects.

The present invention also includes a method for running a simulation. In other words, the creator/author is able to switch between a mode of executing and a mode of authoring a simulation. The author also can specify which characters will be simulated (i.e., the statements and actions of the characters are generated by the system) and which characters are non-simulated (i.e., the user inputs the actions and speech for the character). The engine interprets the objects in the active simulation and executes the appropriate subroutines to execute the object. The engine displays the output of the simulation through the simulation user interface on the output device.

The system also includes a method of generating statements and analyzing input statements. When writing the simulation, the author identifies acceptable statements. The author may also identify acceptable alternates for key words in the statement. When the engine executes a message bubble objects, the engine either generates the statement, if the character is simulated, or analyzes the input from the user, if the character is non-simulated. When generating a statement for a simulated character, the system uses the same key words. The system generates appropriate statements by linking together the key words. The system may choose at random or sequentially from the alternates for the key words. In this way the system can generate different statements that are appropriate to the situation. When analyzing an input for a non-simulated character, the system parses the input and analyzes the parts for the key words or their alternates. If the system finds the key words in the statement, the system accepts the input.

DESCRIPTION OF THE PREFERRED EMBODIMENT

Figure 1:
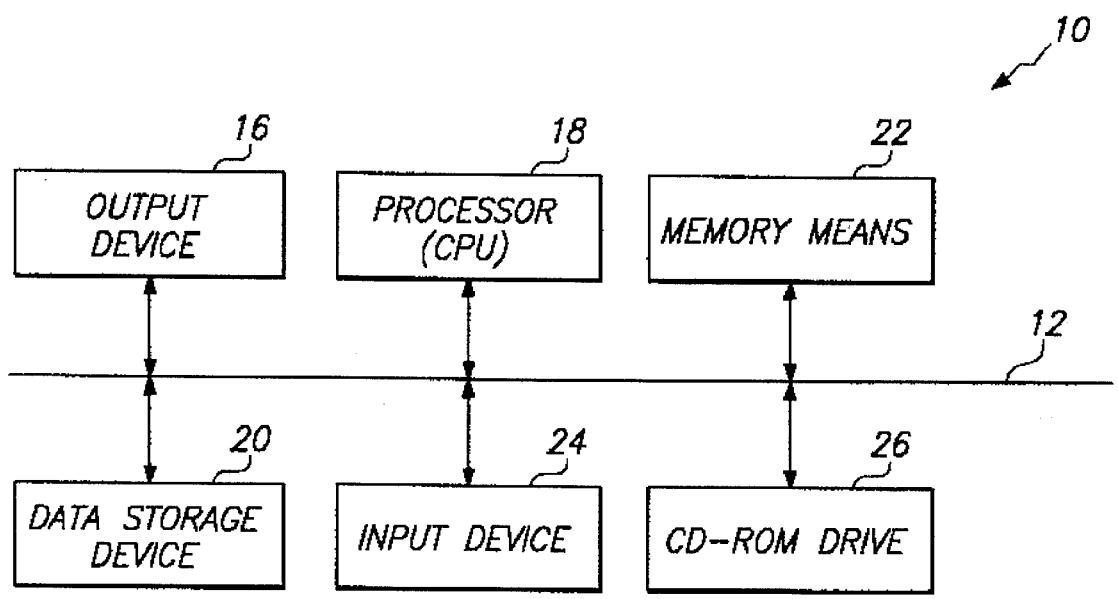
FIG. 1 is a block diagram of a preferred embodiment of a system for creating and executing interactive interpersonal computer simulations constructed according to the present invention.

Referring now to FIG. 1, a preferred embodiment of a system 10 for creating and executing interactive interpersonal computer simulations is shown. The system 10 preferably comprises an output device 16, a processor (Central Processing Unit) 18, a data storage device 20, a memory means 22, an input device 24, and a CD-ROM drive 26. The output device 16, the processor 18, the data storage device 20, the memory means 22, the input device 24, and the CD-ROM drive 26 are preferably coupled together by a bus 12 in a von Neuman architecture. Those skilled in the art will realize that these components 12, 16, 18, 20, 22, 24, and 26 may be coupled together according to various other computer architectures without departing from the spirit or scope of the present invention.

The output device 16 preferably comprises a computer monitor for displaying high resolution graphics and speakers for outputting high fidelity audio signals. The output device 16 is used to display an authoring user interface 37 including a representation of the simulation when the user/author is creating a simulation. The author uses the input device 24 to manipulate graphical icons at various locations shown on the output device 16 to create the simulation. The output device 16 is also used to output video images and sound forming a simulation while such simulation is being executed by the system 10.

The processor 18 preferably executes programmed instruction steps, generates commands, stores data, and analyzes data configurations according to programmed instruction steps that are stored in the memory means 22 and in the data storage device 20. The processor 18 is preferably a microprocessor such as the Motorola 68040 or the Intel 80486.

The data storage device 20 preferably is a disk storage device for storing data and programmed instruction steps. In the exemplary embodiment, the data storage device 20 is a hard disk drive. Simulations, when not being created or executed, are stored in the data storage device 20.

The preferred embodiment of the input device 24 comprises a keyboard and mouse type controller. The input device 24 may also include a microphone and a speech recognition system. The input device 24 is used to input text or voice data along with data from a mouse type controller. Data and commands to the system 10 are input through the input device 24.

The CD-ROM drive 26 is a disk drive for compact disks. Many of the scenes of a simulation may be performed by actors and recorded on a compact disk as video clips, audio clips, or both. During the execution of a simulation, the system 10 may display video and audio clips recorded on a compact disk using the CD-ROM drive 26. The CD-ROM drive 26 may store video, audio, and other data.

Figure 2:
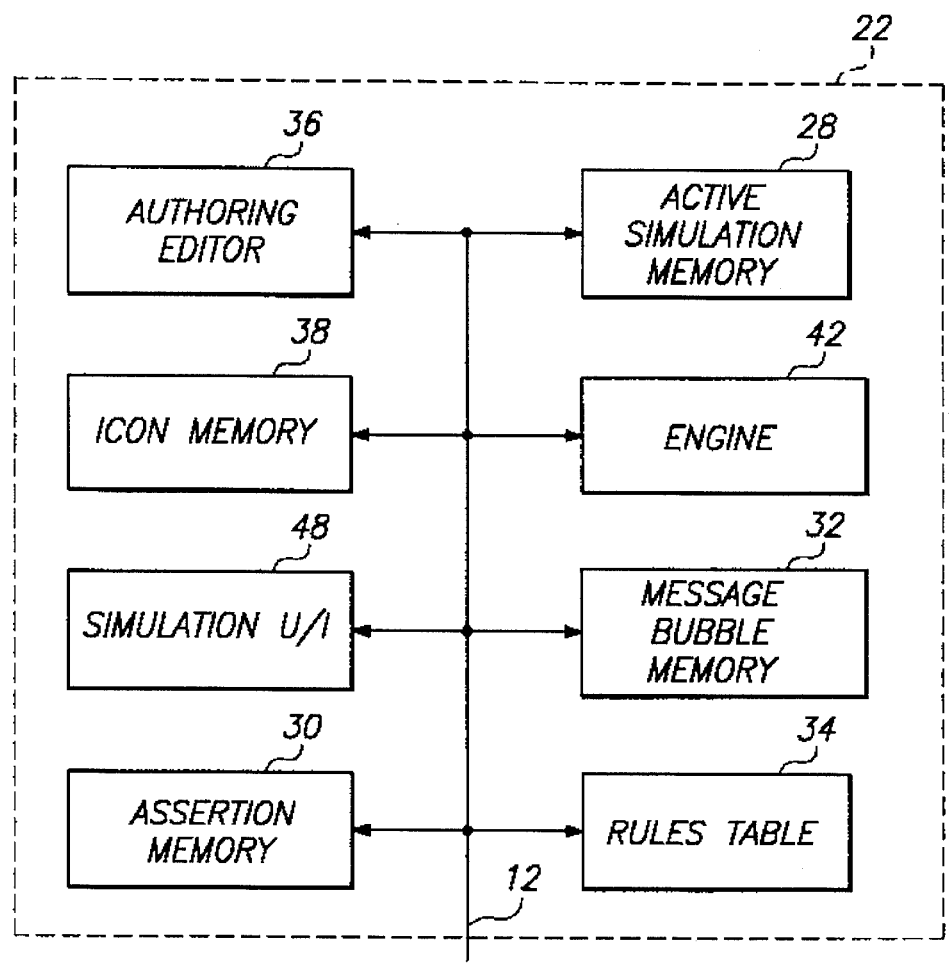
FIG. 2 is a block diagram of the preferred embodiment for a memory means in the system of the present invention.

Referring now to FIG. 2, a block diagram of the memory means 22 is shown. The memory means 22 is preferably a predetermined amount of dynamic random access memory, a read only memory, or both. The memory means 22 stores data, operating systems, and programmed instruction steps. In particular, the memory means 22 includes an active simulation memory 28, an assertion memory 30, a message bubble memory 32, a rules table 34, an authoring editor 36, a memory for icons, video, sound, and other data (the "icon memory") 38, an engine 42, and a simulation user interface ("simulation U/I") 48. Those skilled in the art will realize that the active simulation memory 28, authoring editor 36, icon memory 38, the engine 42, the simulation U/I 48, the assertion memory 30, the message bubble memory 32, and the rules table 34 could also be stored in contiguous blocks of memory.

The active simulation memory 28 is used to store a sequence of programmed instruction steps forming the simulation that is currently being used by the system 10. The system 10 preferably has two modes of operation: an authoring mode in which simulations are created, and an execution mode in which simulations are run or executed. Thus, the active simulation memory 28 stores the simulation currently being authored or executed by the system 10. In the present invention, simulations are advantageously stored as a group of pre-defined objects that are ordered and associated. Each object represents a construct of the present invention representing a part of the simulation or an action. These objects comprise a chapter object, a strip object, a branch object, a character object, a message bubble object, a query bubble object, an assertion object, a plurality of prop objects, a run time prop object, and a scroll object.

The chapter objects, strip objects, cell objects, and branch objects are the objects that form and help the user to define the organizational structure of the simulation. The chapter objects are the highest level of the organization. Chapter objects may, however, be used within lower organizational objects. Chapter objects provide major divisions for portions of the simulation and include one or more strip objects. Strip objects provide the next organizational sub-division. Strip objects, within a chapter object, are executed in parallel during the execution of the simulation and can be used to provide actions by different elements of the simulation. Cell objects are used to form a strip object and must appear within strip objects. Cell objects are the basic organizational unit of the simulation.

Character objects, message bubble objects, assertion objects, and query bubble objects are the basic action objects of the simulation. The character object represents a person or thing in the simulation. The message bubble object represents a statement or output by a character object. The message bubble object contains a reference to a grammar that is stored in the message bubble memory 32. Each message bubble object is preferably associated with a character object. The query bubble object contains a question about a thing or fact in the simulation. The query bubble object is preferably associated with the character object that represents the thing the question concerns. The assertion object contains a statement of fact about a thing in the simulation. The assertion object is preferably individually associated with the character object that represents the thing the fact concerns. The scroll object and run time prop object represent certain interruptions during the course of the simulation. The prop objects indicate the course, or the next cell to execute, of the simulation.

When an author is creating or editing a simulation, the active simulation memory 28 stores the objects forming the simulation as far as it has been created, as well as pointers to the portion of the simulation that is being created or edited. During execution of a simulation, the active simulation memory 28 stores the simulation and a pointer to the object in the simulation being executed by the engine 42. The active simulation memory 28 is preferably coupled to the authoring editor 36, the icon memory 38, the engine 42, the message bubble memory 32, the assertion memory 30, and the rules table 34.

The memory means 22 also includes an authoring editor 36. The authoring editor 36 is a series of programmed instruction steps for controlling the processor 18 to produce an authoring user interface 37 on the output device 16. The authoring user interface 37 is a graphical user interface for creating a simulation. The authoring editor 36 controls the processor 18 to retrieve portions of the simulation from the active simulation memory 28, to retrieve icons and data from the icon memory 38, and to display the retrieved portions of the simulation using the icons to produce a comic book interface. The authoring editor 36 also controls the processor 18 to receive inputs from the input device 24 in conjunction with the display of the authoring user interface 37, thereby allowing creation of a simulation. In particular, the authoring editor 36 translates the input into corresponding objects and stores the objects in the active simulation memory 28. The author can manipulate the icons displayed by the output device 16 using the input device 24. By positioning the icons and by entering text, the author creates a simulation that the authoring editor 36 stores in the active simulation memory 28. The authoring editor 36 is preferably coupled to the active simulation memory 28 and to the icon memory 38 through the bus 12.

The memory means 22 also includes a plurality of icons, video, sound and other data stored in the icon memory 38. The icons are graphical symbols and each one corresponds to a pre-defined object that is used to form a simulation. The authoring editor 36 generates the icons on the output device 16. The authoring editor 36 also allows the user to create additional icons, for example, for new character objects. The authoring editor 36 uses the icons to provide an interface that is simple and easy for the author to understand when creating a simulation. The video, sound and other data are used by the simulation user interface 48 for presenting images or producing sound with the output device 16 when the simulation is executed.

The engine 42 is the means by which the system 10 executes a simulation. The engine 42 is a series of programmed instruction steps that control the processor 18 when the system 10 is executing a simulation. The engine 42 moves through the active simulation memory 28 from each instance of an object to the next instance of an object. For each class of object, the engine 42 includes subroutines that the processor 18 uses to execute that object. At each instance of an object, the engine 42 recognizes the object, locates the data associated with this object, and by means of the processor 18 implements the appropriate subroutine to execute the object. The engine 42 includes a conventional inference engine to analyze the questions referenced by the query bubble objects. The engine 42 also is the means by which the system 10 generates output statements and analyzes text/statements input by the user. For each occasion where a message bubble object is associated with a character object, the message bubble memory 32 contains a grammar object that includes a plurality of acceptable statement objects which in turn may contain a plurality of grammar objects. For simulated character objects, the engine 42 chooses one of a plurality of acceptable statement objects at random and navigates a path through the grammar objects to generate an output statement. For non-simulated characters (i.e., where the user is acting as the character and must input the statements of the character), the engine 42 parses and compares the input to the grammars 64 for a match. The engine 42 is coupled to the active simulation memory 28, to the processor 18, to the icon memory 38, to the message bubble memory 32, to the assertion memory 30, to the rules table 34, and to the simulation U/I 48 through the bus 12.

The simulation U/I 48 is an interface for presenting a simulation to the user through the output device 16. The simulation U/I 48 manages the outputting of video, text, and audio in response to signals from the engine 42 and the user during simulation execution. The simulation U/I 48 also manages the inputting of text or audio signals from the user during a simulation. The simulation U/I 48 is coupled to the engine 42 through the bus 12.

The assertion memory 30 is a data register for storing statements of fact made about character objects through the execution of assertion bubble objects during a simulation. Each time an assertion bubble object is executed, the engine 42 stores the stated fact in the assertion memory 30 with a reference to the character object about which the fact concerns. These facts are used by the engine 42 to determine the answers to the questions contained in query bubble objects. The assertion memory 30 is coupled to the engine 42 through the bus 12.

The message bubble memory 32 is a data register that stores a plurality of grammar objects from which the engine 42 constructs outgoing statements and analyzes incoming statements. The message bubble memory 32 contains grammar objects which themselves may contain acceptable statement objects, grammars objects, key word objects, and all other data associated with the message bubble objects. The message bubble memory 32 is coupled to the engine 42 and to the authoring editor 36 through the bus 12.

The rules table 34 is a data register that contains a table of rules that the engine 42 uses to answer the questions associated with query bubble objects. The author must write the rules as a part of the basis of the simulation. During the simulation, the engine 42 applies the rules table 34 to the assertion memory 30 to infer the answers to queries. For example, the author may write the rule "If a character likes broccoli, carrots, or lima beans, then the character likes vegetables." During the simulation the assertion is made that a character likes broccoli. This assertion is stored in the assertion memory 30. Thus, if there is a query bubble object that contains a reference to the question, "Does this character like vegetables?" the engine 42 applies the rules table 34 to the assertion memory 30 and generates an answer of true.

Figure 3:
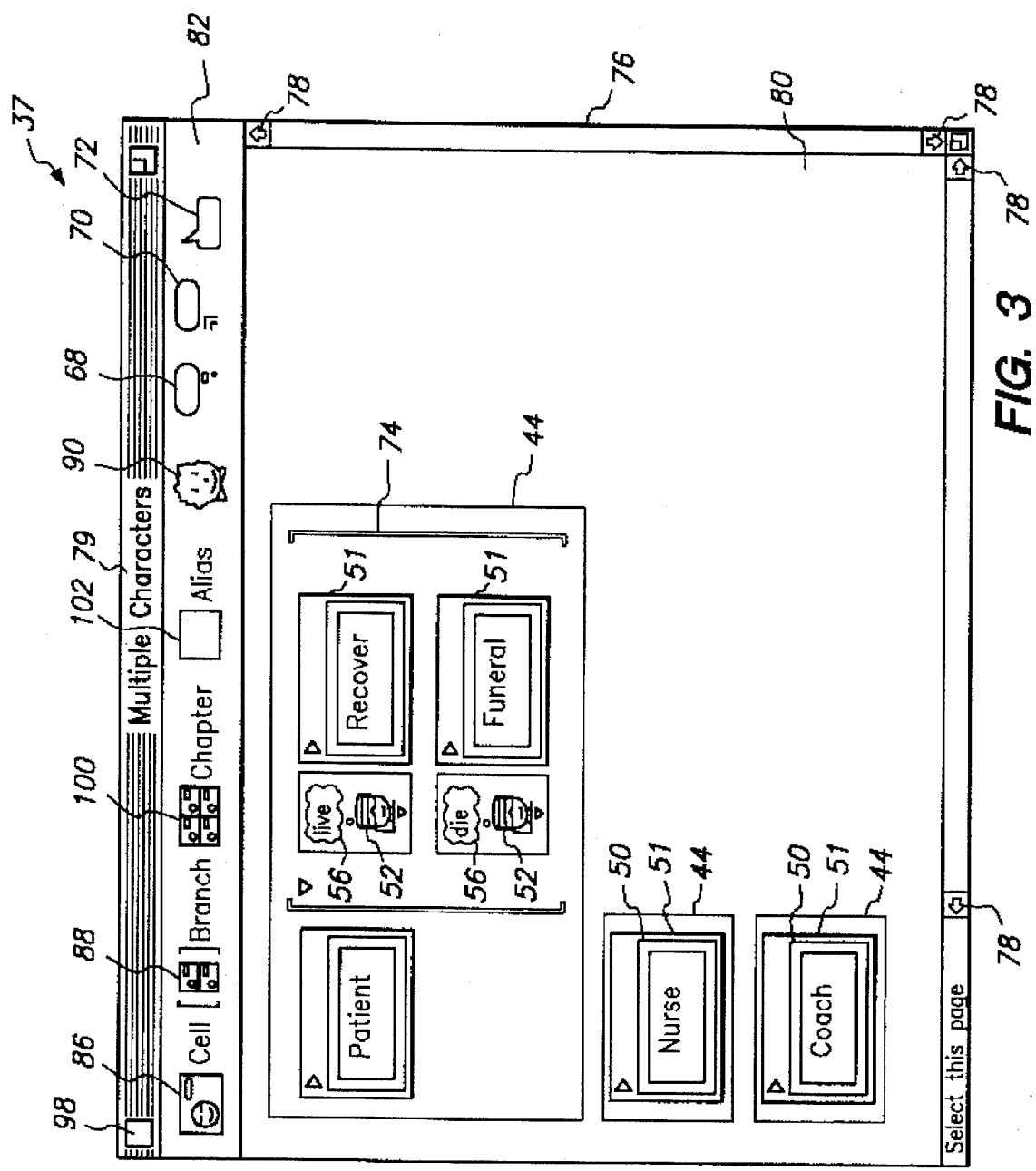
FIG. 3 is a graphical representation of the output device showing a first embodiment of an authoring user interface of the present invention.

Referring now to FIG. 3, a graphical representation of a first embodiment of the authoring user interface 37 having three strip objects (one for a patient, one for a nurse and one for a coach) is shown. The authoring user interface 37 includes portions of a standard Apple Macintosh system 7.1 user interface such as a re-sizable window 76, scroll bars 78, a title bar 79, and a closing button 98. The closing button 98 is a means for removing the authoring user interface 37 from the output device 16 and ending an editing session by deactivating the authoring editor 36. The area within the window 76 is preferably divided into an authoring region 80 and a button region 82. The user may create a simulation by positioning icons representing one or more objects within the authoring region 80. The present invention advantageously provides a unique icon representing each of the pre-defined objects on the output device 16 in the editing mode. These icons and the authoring user interface 37 advantageously take the form of a comic book. The system 10 of the present invention advantageously provides icons for chapter objects, strip objects, cell objects, branch objects, characters objects, message bubble objects, assertion bubble objects, query bubble objects, prop objects, run time prop objects, and scroll objects. The comic book form is advantageous because it offers authors a simple, easily understood environment in which to create a simulation. The comic book form is independent of language and may be used to describe any interpersonal interaction. An author, without knowledge of computer programming, is able to create a simulation by manipulating the icons within the authoring user interface 37. Thus, the system 10 provides a means for any person to create sophisticated simulations in any language. Furthermore, each object is pre-defined and complete. Once an object is entered into the active simulation 28, the simulation, as far as the system is concerned, is complete, and the engine 42 may execute it. The system 10 is able to execute the simulation at any time that it is not in the authoring mode. An author may have the system 10 execute the simulation after the addition to the simulation of any object. The ability to immediately see the simulation as it is being written is a powerful tool to aid the author in creating the simulation.

Figure 4:
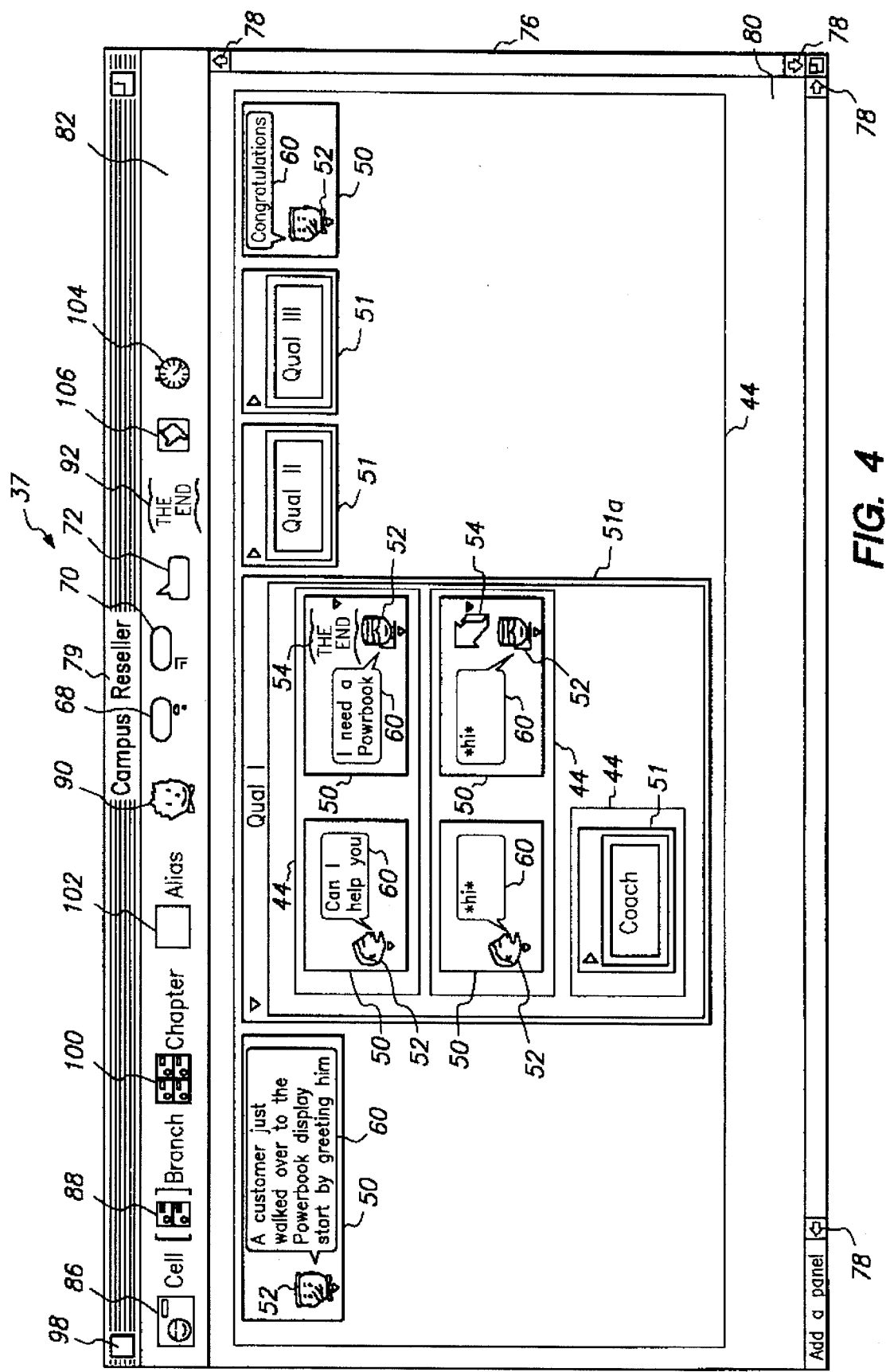
FIG. 4 is a graphical representation of the output device showing a second and preferred embodiment of the authoring user interface of the present invention.

A chapter object is the highest level organizational structure of a simulation. In the preferred embodiment, every simulation must contain at least one chapter object. A chapter object may contain other chapter objects which in turn may themselves contain chapter objects. When the system 10 is in the editing mode, the authoring editor 36 represents a chapter object within the authoring user interface 37 on the output device 16 with a chapter icon 51. In general the authoring editor 36 does not display the highest level chapter icon 51. The chapter icon 51 may be in the shape of a square with the title of the chapter object displayed in the center of the square. Alternatively, the chapter icon 51a may be an open chapter icon 51a (as shown in FIG. 4) in the form of a larger square with the title of the chapter at the top of the chapter icon 51a and the contents of the chapter object displayed within the chapter icon 51a. As shown in FIG. 3, there are five chapter icons 51 or 51a: one for a patient, one for a nurse, one for a coach, one for recovery, and one for a funeral.

Each chapter object comprises one or more strip objects. Each strip object is a portion of the simulation and is executed, by the engine 42, in parallel with the other strip objects within the chapter object. When in the editing mode, the authoring editor 36 displays, on the authoring user interface 37, a strip object icon 44, in the form of a shaded horizontal band within a chapter icon 51a. The authoring editor 36 automatically creates a strip object when the author places a cell object in any part of the active simulation memory 28 other than in an already existing strip object.

The strip objects, represented by the strip icons 44, may be as shown in FIG. 3, dedicated to different character objects. The dedication and use of the strip objects is within the discretion of the author. The author may dedicate a strip object to each character object such that only one character object appears in each strip object. The author may alternatively, as shown in FIG. 4, use only one strip object in the chapter object and have all character objects appear in that one strip object. The author may also dedicate a strip object to each character object, but things, other than the character object to which the strip object is dedicated, may appear in another strip object. In this situation, the relative frequency that a character object appears in a strip object, other than the strip object dedicated to that particular character object, is entirely within the discretion of the author.

In the exemplary embodiment, one engine 42 executes all strip objects. The engine 42 executes the chapter object beginning with the strip object that is represented by the top strip object icon 44 as shown on the output device 16. The engine 42 executes the objects contained in the strip object until the engine 42 finds an object that it can not, at that time, successfully execute. The engine 42 then moves to the strip object that is represented by the second strip object icon 44 shown on the output device 16. The engine 42 repetitively rotates through the strip objects from, as the strip object icons are shown on the output device 16, top to bottom searching for an object that it can successfully execute. When the engine 42 finds an object that it can execute, the engine 42 executes that object and continues to execute the objects in that strip object. When the engine 42 completes the execution of a strip object from which it should leave the chapter object, the engine 42 leaves the chapter object and ends execution of all other strip objects in the chapter object that it is leaving. Those skilled in the art will realize that alternatively a plurality of engines 42 may be used to execute a chapter object with each strip object of the chapter object having an engine 42 dedicated to it. In the exemplary embodiment, one engine 42 executes all strip objects of a chapter object.

A cell object is a sub-division of a strip object. The cell object is the basic structural construct of a simulation. Each cell object must be within a strip object. If the author attempts to place a cell object into the active simulation memory 28, but not within a strip object, the authoring editor 30 will create a new strip object to contain the cell object. Within the cell object, other objects are arranged to indicate to the engine 42 the actions of the simulation. When the system 10 is in the editing mode, the authoring editor 36 displays a cell icon 50 in the authoring user interface 37 on the output device 16. The cell icon 50 has the shape of a rectangular box.

A branch object is a set of alternate simulation paths within a strip object. Each alternate path of the branch object is itself a strip object. The engine 42 attempts to execute the first object of each strip object in turn. At the first successful execution, the engine 42 will continue to execute the objects of that strip object. The engine 42 will then only execute the objects of that strip object and will not execute the objects of the alternate strip objects of the branch object. When the system 10 is in the editing mode, the authoring editor 36 displays a branch icon 74 in the authoring user interface 37 on the output device 16. The branch icon 74 is in the form of a set of brackets with a plurality of strip icons 44 within the brackets.

Each character object represents a separate unique entity that maintains an identity throughout the simulation. The character object may represent anything whether animate or inanimate. Often the character object represents a person. Character objects may represent sub-units of other character objects. For example, in a simulation of an interaction between a doctor and a patient, a character object may represent a limb or organ of the patient. The character object that represents the limb or organ is separate and distinct from the character object that represents the patient. A character object may only exist within a cell object. When the system 10 is in the editing mode, the authoring editor 36 displays a character icon 52 to represent a character object in the authoring user interface 37 on the output device 16. The character icon 52 is generally in the shape of a human face. Those skilled in the art will realize that an icon in a shape representative of the thing represented by the character object may be used. In the preferred embodiment, each separate unique entity may be represented by a visually distinct character icon 52. Preferably, each character object for the same unique entity will have the same character icon 52 representation.

A message bubble object is a data structure that contains a reference to a location in the message bubble memory 32 at which a grammar object resides. Each message bubble object must be individually associated with a character object. The grammar object, whose address the message bubble object contains, is the statement of the character object to whom the message bubble object is associated. If the character, which the character object represents, is simulated, the engine 42 will generate the statement from the grammar object. If on the other hand the character is not simulated, the engine 42 will expect an input statement, from the input device 24. The engine 42 analyzes the input statement from the user for a match with the grammar object. If the engine 42 determines that there is a match between the grammar object and the input statement, the engine 42 continues the simulation by selecting the next object, in the strip object, to be simulated. When the system 10 is in the editing mode, the authoring editor 36 displays a message bubble icon 60 in the authoring user interface 37 on the output device 16. The message bubble icon 60 is displayed in close proximity with the icon representing the character object with which it is associated. The message bubble icon 60 is generally in the shape of a bubble with a carrot appended to the bubble. The authoring editor 36 displays at least the initial words of the grammar object within the message bubble icon 60.

An assertion bubble object is a data structure that contains a statement of fact concerning a character object. The assertion bubble object is individually associated with the character object about which the fact concerns. Assertion bubbles objects are for the internal use of the simulation; the facts contained in assertion bubbles objects are not outputted to the user during execution. When the engine 42 selects an assertion bubble object during a simulation, the engine 42 has the processor 18 execute subroutines that identify the character object with which the assertion bubble object is associated and store the fact and a reference to the character object with which it is associated in the assertion memory 30. When the system 10 is in the editing mode, the authoring editor 36 displays an assertion bubble icon 58 in the authoring user interface 37 on the output device 16. The assertion bubble icon 58 is generally in the shape of a bubble with a plurality of arrows pointing to the bubble. The authoring editor 36 displays at least the initial words of the statement of fact within the assertion bubble icon 58. The assertion bubble icon 58 is displayed in close proximity with the icon representing the character object with which it is associated.

A query bubble object is a data structure that contains a question. The query bubble object is associated with a character object, and the question concerns the associated character object. The answer to the question must be answerable either as "true" or as "false." When the engine 42 comes upon a query bubble object during the execution of the simulation, the engine 42 has the processor 18 execute subroutines that identify the character object with which the query bubble 56 is associated and attempt to answer the question from the facts stored in the assertion memory 30. The engine 42 may not be able to answer the question explicitly. The subroutines may have to use the inference engine included in the engine 42 to infer an answer. If the answer to the question is "true," the engine 42 may continue executing the objects in the current strip object by selecting the next object in the strip object. If the answer to the question is "false," the engine 42 may not continue to execute the strip object until the answer to the query bubble object becomes "true." The engine 42 will note the query bubble object in the memory means 22 as active. Since the answer to a query bubble object is based upon the facts contained in assertion memory 30, the engine 42 preferably re-evaluates an active query bubble object only after an assertion bubble object has been executed. If, after an assertion bubble object has been executed, the answer to the query bubble object becomes "true," the engine 42 may continue to execute the strip object that contained the active query bubble object. When the system 10 is in the editing mode, the authoring editor 36 displays a query bubble icon 56 in the authoring user interface 37 on the output device 16. The query bubble icon 56 is generally in the shape of a bubble with a plurality of circles of increasing size associated with it. The authoring editor 36 displays at least the initial words of the question in the query bubble icon 56. The query bubble icon 56 is displayed in close proximity with the icon representing the character object with which it is associated.

An alias object is an object that provides a means for the engine 42 to go to a cell object other than the next cell object in the current strip object. The author may create an alias object for any cell object in the simulation and may place the alias object in another cell object. If the author places an alias object in a cell object, then when the engine 42 executes the cell object that contains the alias object, the engine, 42 actually executes the cell object that the alias object represents. When the system 10 is in the editing mode, the authoring editor 36 displays an alias icon in the authoring user interface 37 on the output device 16. The alias icon is preferably in the shape of a square with a visually distinct background.

In the button region 82 of the authoring user interface 37, the authoring editor 36 displays a plurality of buttons. The buttons represent a means for creating instances of the objects in the active simulation memory 28. Once an instance of an object is created, the authoring editor 36 automatically generates an instance of the icon associated with the object in the authoring region 80. The button icons of the button region 82 shown in FIG. 3 comprise a cell button icon 86, a branch button icon 88, a chapter button icon 100, an alias button icon 102, a character button icon 90, a query bubble button icon 68, an assertion bubble button icon 70, and a message bubble button icon 72. In general, the user activates the buttons by means of the input device 24. The user positions the cursor over the icon of the desired button and clicks the input device 24. An icon of the object corresponding to the button appears. The user then drags the icon to the desired position in the authoring region 80 and drops the icon. The authoring editor 36 then creates an instance of the object at the position in the active simulation memory 28 that corresponds to the position in the authoring region 80 at which the icon was dropped. The authoring editor 36 also displays on the authoring user interface 37 the icon of the object at the position at which it was dropped.

The cell button means is a means for creating an instance of a cell object. When the user selects the cell button means, the authoring editor 36 stores a new cell object in the active simulation memory 28. The authoring editor 36 also records the strip object in which the cell object is placed and the cell objects that surround the new cell object. The user may place a new cell object anywhere in a strip object. If the user places the new cell object among existing cell objects, the authoring editor 36 creates a space in the active simulation for the new cell object and adjusts the records of the cell objects that surround the new cell object to reflect the new relationships among the cell objects. Should the author desire to place a cell object icon 50 in a portion of the simulation not displayed in the authoring region 80 of the authoring user interface 36, the author may increase the size of the window, may use the scroll bars 78 to display other portions of simulation in the authoring region 80, or may do both. When the system 10 is in the editing mode, the authoring editor 36 displays a cell button icon 86 in the authoring user interface 37 on the output device 16. The cell button icon 86 is in the form of a rectangle, with figures of a human face and an oval within the rectangle, associated with it.

The branch button means is a means for creating an instance of a branch object. When the user clicks on the branch button icon 88 and drops the branch icon 74 into the desired position in the authoring region 80, the authoring editor 36 creates an instance of a branch object by recording a branch object in the appropriate position in the active simulation memory 28. The author adds cell objects and strip objects to the branch object. When the system 10 is in the editing mode, the authoring editor 36 displays a branch button icon 88 in the authoring user interface 37 on the output device 16. The branch button icon 88 is in the form of a set of brackets with two cell button icons 50 of reduced size within the brackets.

A chapter button means is a means for creating an instance of a chapter object. When the author selects the chapter button means and drops a chapter icon 51 into the authoring region 80, the authoring editor 36 creates a new chapter object at the corresponding position in the active simulation memory 28. The authoring editor 36 also establishes the relationships between the chapter object and the surrounding chapter objects and cell objects. When the system 10 is in the editing mode, the authoring editor 36 displays a chapter button icon 51 in the authoring user interface 37 on the output device 16. The chapter button icon 51 is in the form of a rectangle surrounding four cell button icons 50 of reduced size.

The alias button means is a means for creating an instance of an alias object. When the author selects the alias button means, the authoring editor 36 automatically places a cell object around the alias object and places both objects in the appropriate position in the active simulation memory 28. The display is also similarly updated by the authoring editor 36. The author then selects a cell icon 50 in the authoring region 80, that represents the cell object for which the author is creating an alias object and drags and drops the cell icon 50 into the alias icon in the authoring region 80. The authoring editor 36 records, in the alias object, the cell object that it represents. When the system 10 is in the editing mode, the authoring editor 36 displays an alias button icon 102 within the authoring user interface 37 on the output device 16. The alias button icon 102 is in the form of a shaded rectangle.

The character button means is a means for creating an instance of a character object. When the system 10 is in the editing mode, the authoring editor 36 displays a character button icon 90 in the authoring user interface 37 on the output device 16. The character button icon 90 is identical in form to one of the character object icons 52. In the exemplary embodiment, when the author selects the character button means, the authoring editor 36 displays a pull down menu. Buttons for all the character objects that the author has created in the simulation appear. The author may then select any of the character objects. The character icon 52 corresponding to the user's selection appears, and the user may drop the character icon 52 in the desired position within a cell icon 50 in the authoring region 80. When the user drops a character icon 52 in a cell icon 50, the authoring editor 36 records, in the active simulation memory 28, the position of the character object in the cell object. If the author attempts to drop a character icon 52 at a point that is outside a cell icon 50, the authoring editor 36 will locate the corresponding position in the active simulation, determine that the position is outside a cell object, and reject the input.

The query bubble button means is a means for creating an instance of a query bubble object. When the author selects the query bubble means and drags and drops a query bubble icon 56 into the authoring region 80, the authoring editor 36 checks the position and, if it is allowable, creates an instance of a query bubble object at the corresponding position in the active simulation memory 28. The authoring editor 36 first determines if the corresponding position is within a cell object and then if it is individually associated with a character object. If the position does not meet these two requirements, the authoring editor 36 rejects the input. If the position does satisfy the requirements, the author may now select to enter the question for the query bubble object. When the author does this, the authoring editor 36 stores the question with the query bubble object in the active simulation memory 28. When the system 10 is in the editing mode, the authoring editor 36 displays a query bubble button icon 68 in the authoring user interface 37 on the output device 16. The query bubble button icon 68 is preferably identical to the query bubble icon 56.

The assertion bubble button means is a means for creating an instance of an assertion bubble object. When the author selects the assertion bubble means and drags and drops an assertion bubble icon 58 into the authoring region 80, the authoring editor 36 checks the position and, if it is allowable, creates an instance of an assertion bubble object at the corresponding position in the active simulation memory 28. The authoring editor 36 first determines if the corresponding position is within a cell object and then if it is individually associated with a character object. If the position does not meet these two requirements, the authoring editor 36 rejects the input. If the requirements are met, the author may now enter the statement of fact into the assertion bubble object. When the author enters the statement of fact, the authoring editor 36 stores the fact with the assertion bubble object in the active simulation. When the system 10 is in the editing mode, the authoring editor 36 displays an assertion bubble button icon 70 in the button region 82 authoring user interface 37. The assertion bubble button icon 70 is identical to the assertion bubble icon 58.

The message bubble button means is a means for creating an instance of a message bubble object. The author selects the message bubble means and drags and drops a message bubble icon 60 into the authoring region 80. The authoring editor 36 checks the position and, if it is allowable, creates an instance of a message bubble object at the corresponding position in the active simulation memory 28. The authoring editor 36 tests for the same two position conditions as for query bubble objects and assertion bubble objects. If the position does not meet these two requirements, the authoring editor 36 rejects the input. If the position does meet the requirements, the author may enter the grammar object into the message bubble object. The inputting of a grammar object will be described in detail in connection with FIG. 5. When the system 10 is in the editing mode, the authoring editor 36 displays a message bubble button icon 72 in the button region 82 of the authoring user interface 37. The message bubble button icon 72 is identical to the message bubble icon 60.

When the author has completed creating a simulation, or desires to end a writing session, the author may close the authoring editor 36 by clicking on the closing button 98.

Those skilled in the art will recognize that the icons associated with objects or buttons may take on a variety of forms and are not limited to those in the exemplary embodiment.

Referring now to FIG. 4, a graphical representation of a second and preferred embodiment of the authoring user interface 37 is shown. FIG. 4 shows the authoring user interface 37 as shown in FIG. 3 along with additional buttons. FIG. 4 also shows a single strip icon 44, a plurality of prop icons 54 positioned in cell icons 50, a chapter icon 51a within the strip icon 44, a prop button icon 92, a scroll button icon 106, and a run time prop button icon 104. In contrast to FIG. 3, in FIG. 4 the entire simulation is created within one strip object.

FIG. 4 shows another means of choosing different simulation paths. Within the chapter icon 51a shown in FIG. 4, there are a plurality of strip icons 44. When the engine 42 executes the corresponding strip objects, the engine 42 will begin with the first strip object and begin executing the simulation. The author can create an effective branch using multiple strip objects in a nested chapter object. If the author creates the simulation such that the first character object of the first cell object of each strip object is not simulated, is the same type of character object, and has an associated message bubble object; the author has created an effective branch. The engine 42 will rotate between the strip objects until the user enters an input that matches a grammar object referenced by one of the message bubble objects. The engine 42 will begin executing the strip object having the grammar object that matches the input. The engine 42 will never execute the other strip objects because the user has not entered an input that matches the grammar objects for the first message bubble objects associated with the respective character objects.

A prop object is an object that indicates, to the engine 42, the next cell object to be executed. If a prop object is placed in a cell object, the prop object must be the last object within the cell object by definition. If there is no prop object in a cell object, the engine 42 will automatically select the next cell object in the active simulation memory 28. If the last cell object of a strip object does not contain a prop object the engine 42 will end execution of the chapter object when it completes execution of the last cell object. The default prop object is the equivalent of end of a chapter prop object discussed below. Prop objects may also be placed between cell objects within a strip object. In the exemplary embodiment, there are five prop objects. One prop object indicates the end of the chapter object. When the system 10 is in the editing mode, the authoring editor 36 represents the end of chapter prop object with a prop icon 54. The prop icon for the prop object that indicates the end of a chapter object has the form of text "The End" between wavy lines. Another prop object indicates that the engine 42 is to re-execute the current strip object from the beginning of the chapter object. When the system 10 is in the editing mode, the authoring editor 36 provides a visually distinct prop icon 54 for the re-execution of the current strip object. The prop icon 54 for the prop object that indicates the re-execution of a strip object preferably has the form of an arrow pointing to the left. Another prop object indicates that the engine 42 is to execute all strip objects of the current chapter object again. When the system 10 is in the editing mode, the authoring editor 36 displays a re-execute all strip objects as a prop icon 54 with the form of an arrow pointing upwards and to the left. Yet, another prop object indicates that the engine 42 is to execute the cell object again. When the system 10 is in the editing mode, the authoring editor 36 displays this prop object as a prop icon 54 that has the form of a circular arrow closing upon itself. A last prop object indicates that the engine 42 is to wait at the end of the strip object for the completion of one of the other strip objects. When the system 10 is in the editing mode, the authoring editor displays this prop object as a prop icon 54 that has the form of an octagon with the words "Dead End" within the octagon. Those skilled in the art will recognize that there may be any number of different prop objects and that the prop objects of the exemplary embodiment are not exhaustive of all possible prop objects.

The prop objects are of particular importance for indicating to the engine 42 the action to take at the end of a strip object. As the engine 42 executes the strip objects of a chapter object, the engine 42 may reach the end of one strip object before it reaches the end of the other strip objects. The engine 42 may leave the chapter object when any strip object is completed. A strip object is completed when there are no other objects within the strip object to be executed. If there is a prop object at the end of the strip object that indicates that any portion of the strip object is to be re-executed, then the strip object is never completed. A strip object is completed if there is a default prop object or a "The End" prop object at the end of the strip object. The engine 42 ceases executing all strip objects when it leaves the chapter object. Alternatively, the engine 42 may simply stop or may re-execute a strip object when it reaches the end of the strip object. The author may set the prop object so that the engine 42 leaves the chapter object only when one strip object is complete or only when one of a selected set of strip objects are complete, When the engine 42 leaves a chapter object, execution ceases for all strip objects of the chapter object whether or not they are complete.

The prop button means is a means for creating an instance of a prop object. When the system 10 is in the editing mode, the authoring editor 36 displays a prop button icon 92 in the authoring user interface 37 on the output device 16. The prop button icon 92 is identical in form to the icon for a prop object. In the exemplary embodiment, when the author selects the prop button means, the authoring editor 36 displays a pull down menu. Buttons for all the prop objects appear. The author may then select the particular type of prop object desired. The prop icon 54 appears, and the user may drop the prop icon 54 into the desired position within a cell icon 50 in the authoring region 80. When the user drops a prop icon 54 in a cell icon 50, the authoring editor 36 records, in the active simulation memory 28, the position of the prop object in the cell object. If the author attempts to drop a prop icon 54 at a point inside a cell object that is not the last object in the cell object, the authoring editor 36 will locate the corresponding position in the active simulation, determine that the position is outside a cell object, and reject the input. The author may also place any prop object, except for the prop object that requires re-execution of the current cell object, between cell objects in a strip object.

The run time prop objects are data objects that instruct the engine 42 to pause the execution of a strip object for a fixed period of time. A run time prop object may be positioned within a cell object or may be between cell objects in a strip object. When the engine 42 executes a run time prop object, the engine 42 suspends execution of the strip object for the amount of time that the run time prop object indicates. When the system 10 is in the editing mode, the authoring editor 36 displays a run time prop icon 108 in the authoring user interface 37 on the output device 16. The run time prop icon 108 is generally in the shape of a clock. Those skilled in the art will recognize that there may be many different run time props 108 that perform different timing functions.

The scroll object is a data object that instructs the engine 42 to send text through to the simulation U/I 48. A scroll object may exist within a cell object or between cell objects in a strip object. When the system 10 is in the editing mode, the authoring editor 36 displays a scroll icon 110 in the authoring user interface 37 on the output device 16. The scroll icon 110 is in the shape of a scroll.

The scroll button means is a means for creating an instance of a scroll object. When the author selects the scroll button means and drags and drops a scroll icon 110 to location on the authoring user interface 37. The authoring editor 36 determines the corresponding position in the active simulation memory 28 and creates a scroll object at that position. When the system 10 is in the editing mode, the authoring editor 36 displays a scroll button icon 106 in the authoring user interface 37. The scroll button icon 106 has a form identical to the scroll icon 110.

Figure 5:
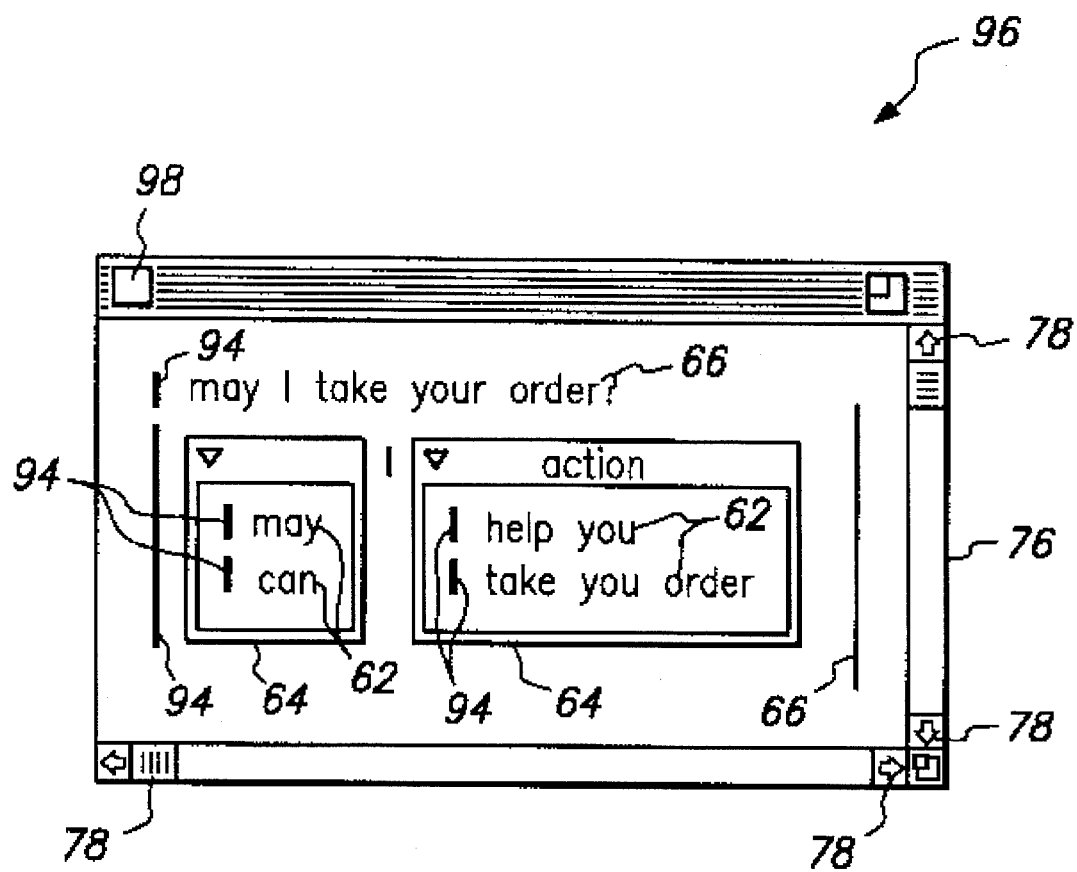
FIG. 5 is a graphical representation of the preferred embodiment of a message bubble interface of the present invention.

Referring now to FIG. 5, a graphical representation of a preferred embodiment of the message bubble U/I 96 is shown. The authoring editor 36 displays the message bubble U/I 96 on the output device 16 when the author is entering a grammar object for a message bubble object. The authoring editor 36 displays the message bubble U/I 96 when the author double clicks on the interior of a message bubble icon 60. The message bubble U/I 96 includes portions of a standard Apple Macintosh system 7.1 user interface such as a re-sizable window 76, scroll bars 78, a title bar 79, and a closing button 98. The closing button 98 is a means for signaling the authoring editor 36 that the author has completed entering a grammar object and desires to return to the authoring user interface 36.

The author inputs a grammar object that comprises an acceptable statement object, a grammar object, a key word object, or an alternate for the key word object.

Each acceptable statement object is a sentence that is appropriate for the output/input by the character object associated with the message bubble object. Each acceptable statement object may include other grammar objects that are subsets of the statement. The grammar objects are made up of a key word object and alternates for the key word object (collectively the "key word object"). The key word object need not be absolutely one word in length; the key word object may be a phrase. The author inputs all acceptable statement objects, divides the acceptable statement objects into grammar objects, and compiles the lists of alternates for the key word objects. A grammar object that contains acceptable statements, other grammar objects, and key word objects may itself be placed as a grammar object within an acceptable statement object. The author may place a word or a phrase between the grammar objects within an acceptable statement object. If the author does this, the words, which are between the grammar objects, must appear in the input statement exactly as they were written by the author. Each grammar object is stored in the message bubble memory 32 with a reference to the message bubble object(s) of the active simulation memory 28 with which the grammar object is associated.

As the author is inputting the acceptable statement objects, grammar objects, and key word objects, the authoring editor 36 displays an acceptable statement icon 66, grammar icon 64, or key word icon 62 for each. The acceptable statement icon 66 has the form of a text string of the sentence. The grammar icon 64 has the form of a box. The key word icon 62 appears within the grammar icon 64 with the key word icon 62 at the top of the box with the alternates listed below. To the right of each acceptable statement icon 66, grammar icon 64, and key word icon 67, the authoring editor 36 displays a bar indicator icon 94. The bar indicator icon 94 has the form of a vertical line. The bar indicator icon 94 is useful for the author to identify the acceptable statement objects.

Certain pre-defined grammar objects are stored in the memory means 22. These pre-defined grammar objects are commonly used words such as the days of the week, the months of the year, or the time of day. The author may call up these pre-defined grammar objects and place them within an acceptable statement object without having to explicitly write the grammar object. There is also a means for the author to write global grammar objects. Global grammar objects are acceptable statement objects that the author writes in an initialization screen 112 of the authoring user interface 36. The global grammar object provides the same functionality as the pre-defined grammar objects. The initialization screen 112 will be discussed in connection with FIG. 6.

When the engine 42 executes a message bubble object, the engine 42 first locates, in the message bubble memory 32, the grammar object referenced by the message bubble object. The engine 42 then determines whether the character object, to which the message bubble Object is associated, is simulated or not simulated. If the character object is simulated, the engine 42 selects an acceptable statement object at random from the grammar object. The engine 42 then traces a path through the grammar objects, if any, of the acceptable statement object. The engine 42 chooses a key word object at random from each grammar object. The engine 42 may select the key word object itself or an alternative key word object. In this way, the engine 42 generates the statement for the character object. The statement is then sent to the simulation U/I 48 to be output as text or as sound by the output device 16. If the character object is not simulated, the engine 42 expects an input via the input device 24. The engine 42 parses the input from the user and then compares the parsed text to the grammar objects of the acceptable statement objects. If the engine 42 finds a match between the parsed text and the grammar object, the engine 42 continues the simulation by executing the next object in the active simulation memory 28. If the engine 42 does not find a match between the parsed text from the input and the grammar object, the engine 42 will not execute any other objects from this strip until the user inputs an acceptable statement. The match between the input statement and the acceptable statement object generally must be exact. The input statement is only allowed to vary within the alternative key word objects or wild card characters of the grammar objects. If the author has placed a word or phrase between two grammar objects, the word or phrase must appear in the input statement exactly as the author has written it in the acceptable statement object. The author may allow for variation beyond that allowed by the key word objects by using wild card characters or symbols. Wild card characters or symbols instruct the engine 42 to accept any input that appears where the wild card is placed. Thus, a wild card placed before the first grammar object of an acceptable statement object, instructs the engine 42 to accept any input text that appears before the first grammar object. The author may also use variables for certain key word objects. The variable first appears with the input for a message bubble object associated with a non-simulated character object. For example, the user may input his name. The engine 42 may define the variable as the word that appears at the point in the statement where the name of the user should appear. The engine 42 will use the definition henceforth when the variable appears in acceptable statement objects for message bubble objects associated with simulated characters objects.

Figure 6:
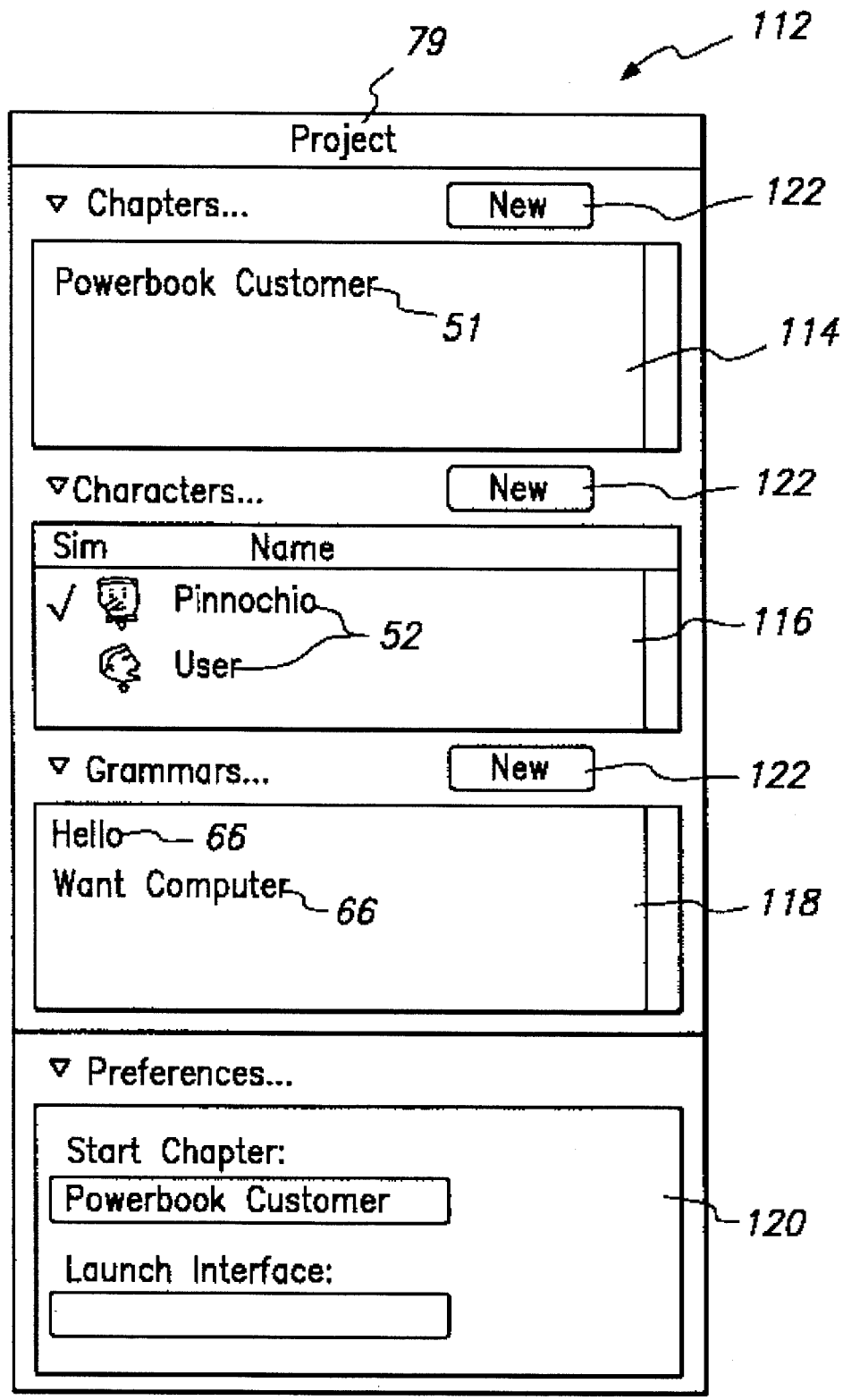
FIG. 6 is a graphical representation of the preferred embodiment of an initialization screen of the present invention.

Referring now to FIG. 6, a graphical representation of a preferred embodiment of an initialization screen 112 is shown. The initialization screen 112 is the first thing displayed by the authoring editor 36 when the author begins creating a simulation. The initialization screen 112 may also be displayed at any time during the authoring of a simulation upon the request of the author. The initialization screen 112 comprises four regions: a chapter region 114, a character/object region 116, a grammars region 118, and a preferences region 120. The initialization screen 112 further comprises a plurality of creation buttons 122.

The chapter region 114 shows the titles of the chapter objects that form the simulation. The present invention preferably only displays the highest layer chapter object and chapter objects that the author desires to use repetitively throughout the simulation. The chapter objects can be listed either by name or by index number.

The character object region 116 lists the character objects of the simulation. Each character object is listed by name along with the character icon 52 that represents the character object, in the editing mode, displayed next to the name. By using the input device 24, the author may indicate whether or not the character object will be simulated or non-simulated when the simulation is executed. If a check appears next to the name of the character object, then the character object is to be simulated by the engine 42. If a check does not appear next to the name of the character object, then the character object will be non-simulated. The status of a character object may be changed from simulated to non-simulated, and vice versa, by double clicking on the name of the character object with the input device 24.

The grammars region 118 displays any global grammar objects. The global grammar objects are grammar objects that the author may use repetitively throughout the simulation. Such global grammar objects may be used alone or nested within other grammar objects. They differ from grammar objects only in that they may be used and/or referenced anywhere in the simulation.

In the preferences region 120, the author sets the first chapter object to be executed when the simulation begins. The first chapter object is generally the highest layer chapter object which includes the entire simulation. If the author specifies another chapter object, which is listed in the chapters region 114, the engine 42 will only execute that chapter object, along with any chapter objects contained in the specified chapter object.

A creation button 122 is positioned within the chapter region 114, the character object region 116, and the grammars region 118. The creation button 122 is a means for creating a new object of the type corresponding with the region in which the new button 122 is located. Thus, the new button 122 in the chapter region 114 is a means for creating a new chapter object. The author may click on the new button 122 and the system 10 will present a dialogue box to create a new chapter 51. Similarly, the author may initialize a new character object by clicking on the creation button 122 in the character object region 116. The author may then enter the name of the character object and assign a character icon 52 to that character object. Initializing a new character object will not place the character object in the simulation. It will only place the name of the character object in the pull down menu associated with the character button 90. This will make the new character object available to the author for placement in the simulation. Likewise, the author may create global grammar objects by clicking on the creation button 122 located in the grammars region 118. When the author clicks on the creation button 122, the authoring editor 36 displays the message bubble interface 96. The author may now enter grammar objects. The grammar objects that the author writes in the grammars region 118 are global objects that may be used repetitively anywhere in the simulation.

Figure 7:
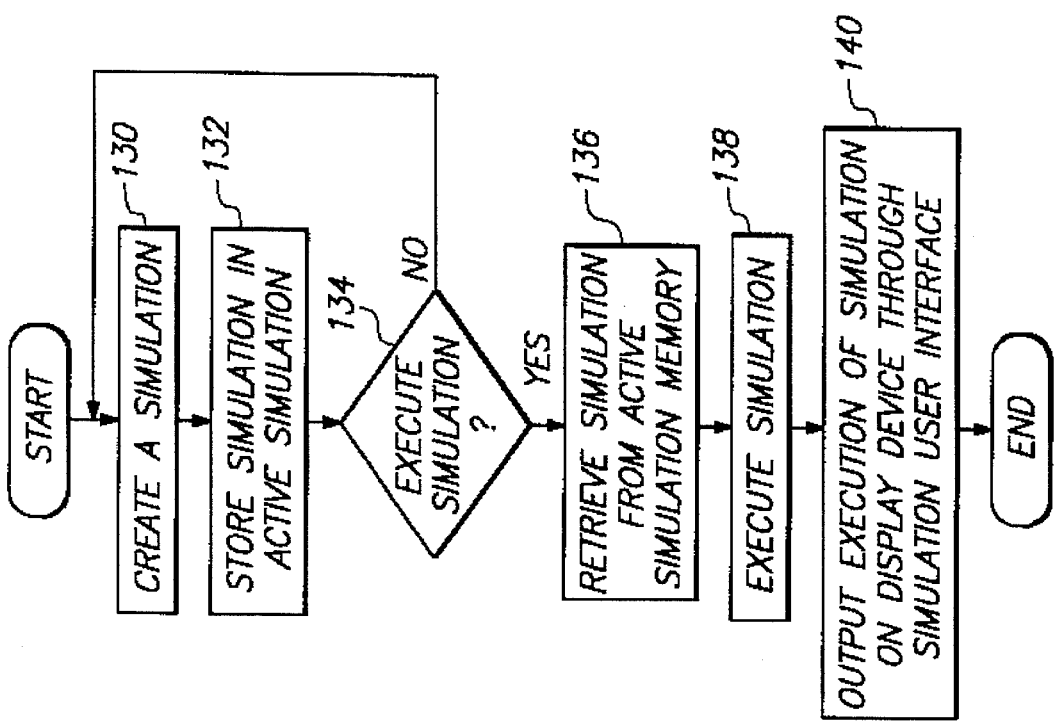
FIG. 7 is a flow chart showing the preferred method for creating and executing simulations utilizing the present invention.

Referring now to FIG. 7, a flow chart of the preferred method for creating and executing a simulation is shown. The authoring user interface 37 is displayed by the system 10, and the author creates a simulation in step 130 using the authoring editor 36. Each addition of an object to the active simulation memory 28 creates a new simulation. The authoring editor 36 stores objects to form a simulation in the active simulation memory 28 in step 132. The simulation may be executed at any time after an object has been placed into the active simulation memory 28. In step 134, the system 10 determines if the author desires to execute the simulation. If the author does not desire to execute the simulation, the system 10 returns to step 130. If the author desires to execute the simulation, the engine 42 retrieves the simulation from the active simulation memory 28 in step 136. In step 138, the engine 42 executes the simulation. The engine 42 outputs the simulation through the simulation U/I 48 on the output device 16 in step 140. Note that all actions by the system 10 are performed by the processor 18 under control of the memory means 22. When a statement is made in this application that the authoring editor 36, the engine 42, or some other entity takes an action, the processor 18 actually takes the action under the control of the programmed instruction steps of the named entity.

Figure 8:
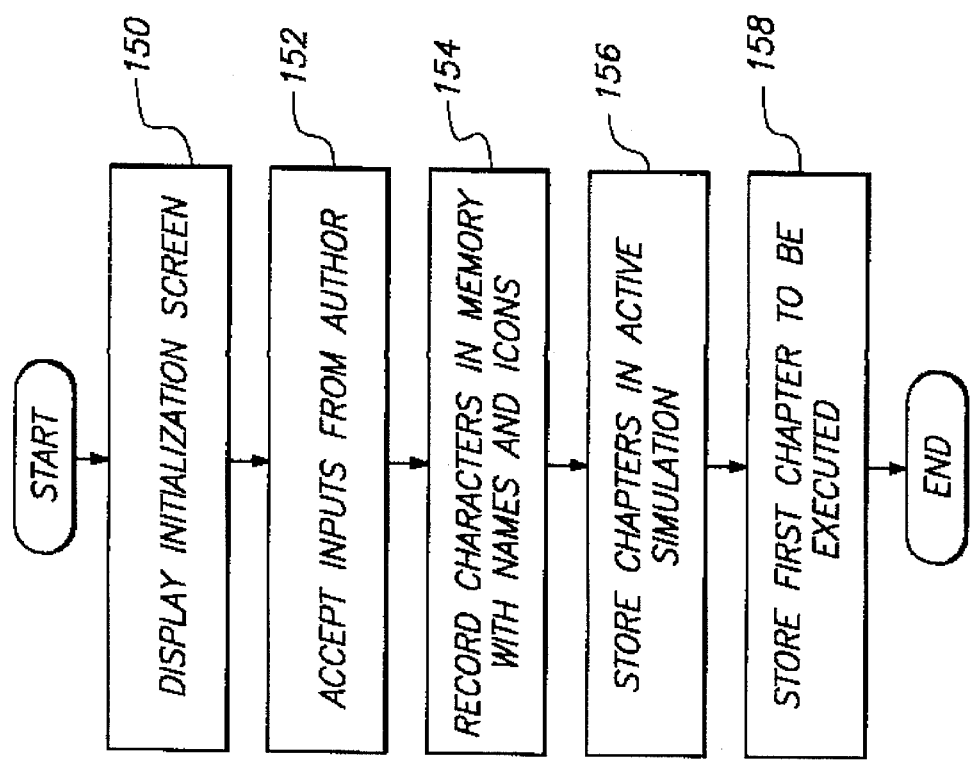
FIG. 8 is a flow chart showing the preferred method of for initializing the creation of a simulation.

Referring now to FIG. 8, a flow chart of the preferred method initializing the system 10 for the creation of a simulation is shown. Beginning in step 150, the authoring editor 36 displays the initialization screen 112 in the authoring user interface 37. In step 152, the system 10 accepts inputs of character objects, chapter objects, and preferences from the author. In step 154, the authoring editor 36 stores in the memory means 22 each character object along with its name and associated icon. The authoring editor 36 also, in step 154, displays the name of each character object and its character icon 52 in the initialization screen on the output device 16. The authoring editor 36 then, in step 156, stores the chapter objects in the active simulation memory 28 and updates the initialization screen 112 on the output device 16. The authoring editor 36 finally, in step 158, stores, in the memory means 22, the name of the first chapter object to run when the simulation is executed. Then the initialization is complete.

Figure 9:
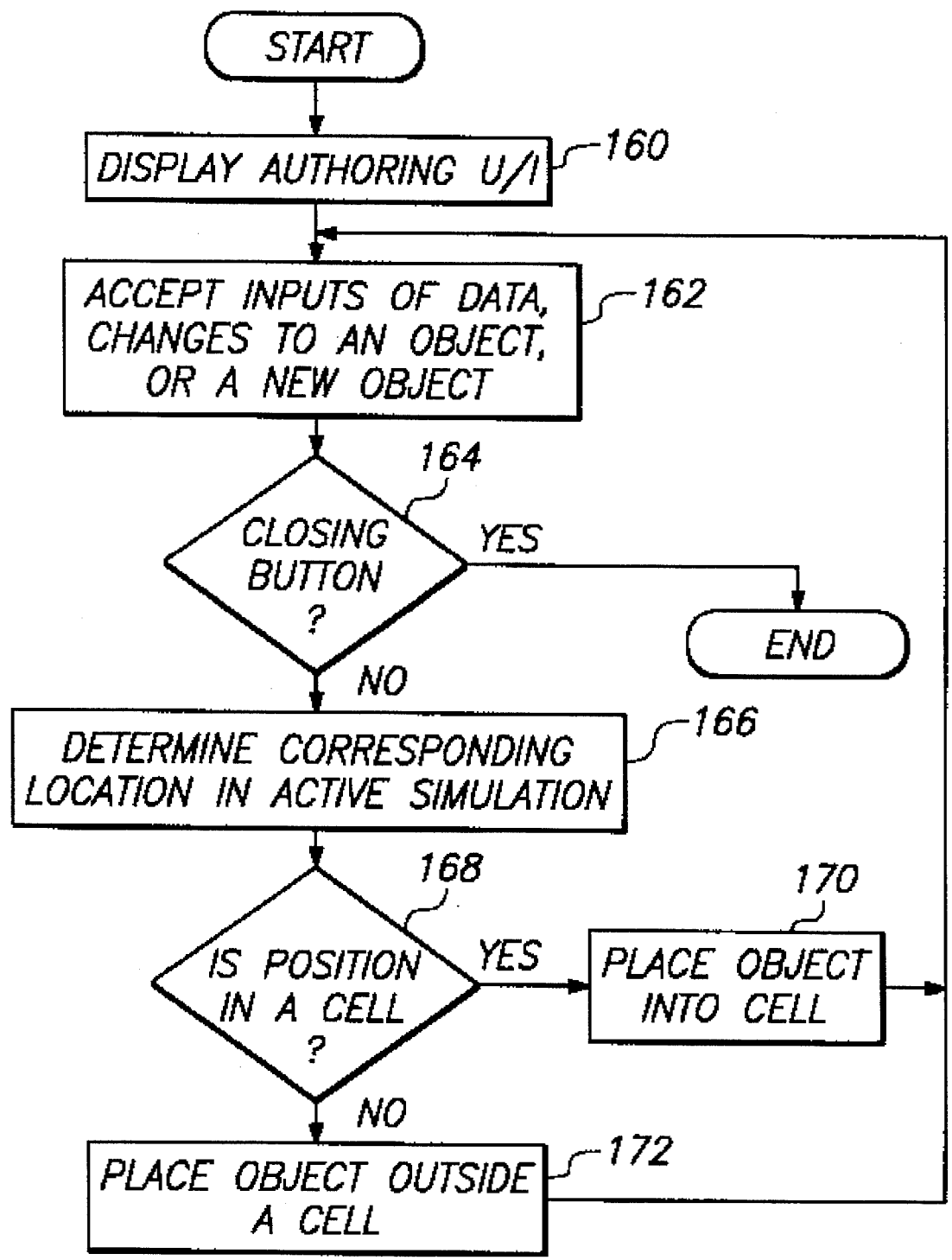
FIG. 9 is a flow chart showing the preferred method for creating a simulation using the system of the present invention.

Referring now to FIG. 9, a flow chart of the preferred method for creating and editing a simulation is shown. The preferred method for creating and editing a simulation begins in step 160 by displaying the authoring user interface 37 on the output device 16 using the processor 18 under control of the authoring editor 36. Next, in step 162, the system 10 accepts inputs such as data, movement of objects, or the creation of an object. In general, the processor 18 under control of the authoring editor 36 receives inputs from the input device 24 such as the initial coordinates of the cursor on the output device 16 (i.e., where the author first clicked the input device 24) and the final coordinates of the cursor on the output device 16 (i.e., where the author dropped the object). The authoring editor 36 translates these conventional drag and drop inputs into positions in the active simulation memory 28.

Next, the authoring editor 36 determines, in step 164, if the author is ending the authoring session. If the author has closed all open chapter icons 51a and clicked on the closing button icon 98 in the initialization screen 112, the authoring editor 36 stores the contents of the active simulation memory 28 in the data storage device 20 and ends the authoring session by removing the authoring user interface 37 from the output device 16. Otherwise, the method proceeds to step 166 where the authoring editor 36 determines the position in the active simulation memory 28 corresponding to the coordinates at which the icon for the object was moved or dropped. (i.e., a beginning position and an ending position) The authoring editor 36 advantageously translates the beginning and ending position of an icon, if an icon was edited, or the ending position of an icon, if a new object is being entered into the corresponding position for the object in the active simulation memory 28. For example, if the user moves a character icon 52 from one cell icon 50 (cell B) to another cell icon 50 (cell C), the display is updated by the authoring editor 36, and in step 166 the authoring editor 36 determines the location in the active simulation memory 28 of the character object corresponding to the character icon 52, and also determines the new location in the active simulation memory 28 corresponding to cell C. When a new object is being created, the authoring editor 36 need only determine the location in the active simulation memory 28 corresponding to where the character icon 52 was positioned since no prior position existed.

The authoring editor 36 then in step 168 determines if the position in the active simulation memory 28 is within a cell object. If the ending position is within a cell object, the authoring editor 36 places the object into the appropriate cell object in step 170. The method by which the authoring editor 36 places the object into a cell object is discussed below in connection with FIGS. 10A & 10B. If the object is not being placed into a cell object, the authoring editor 36 proceeds to step 172 where the authoring editor 36 places the object outside of the cell objects. The method by which the authoring editor 36 places the object among cell objects will be discussed below in connection with FIG. 11. The authoring editor 36 then returns to step 162 to await another input.

Figure 10A:
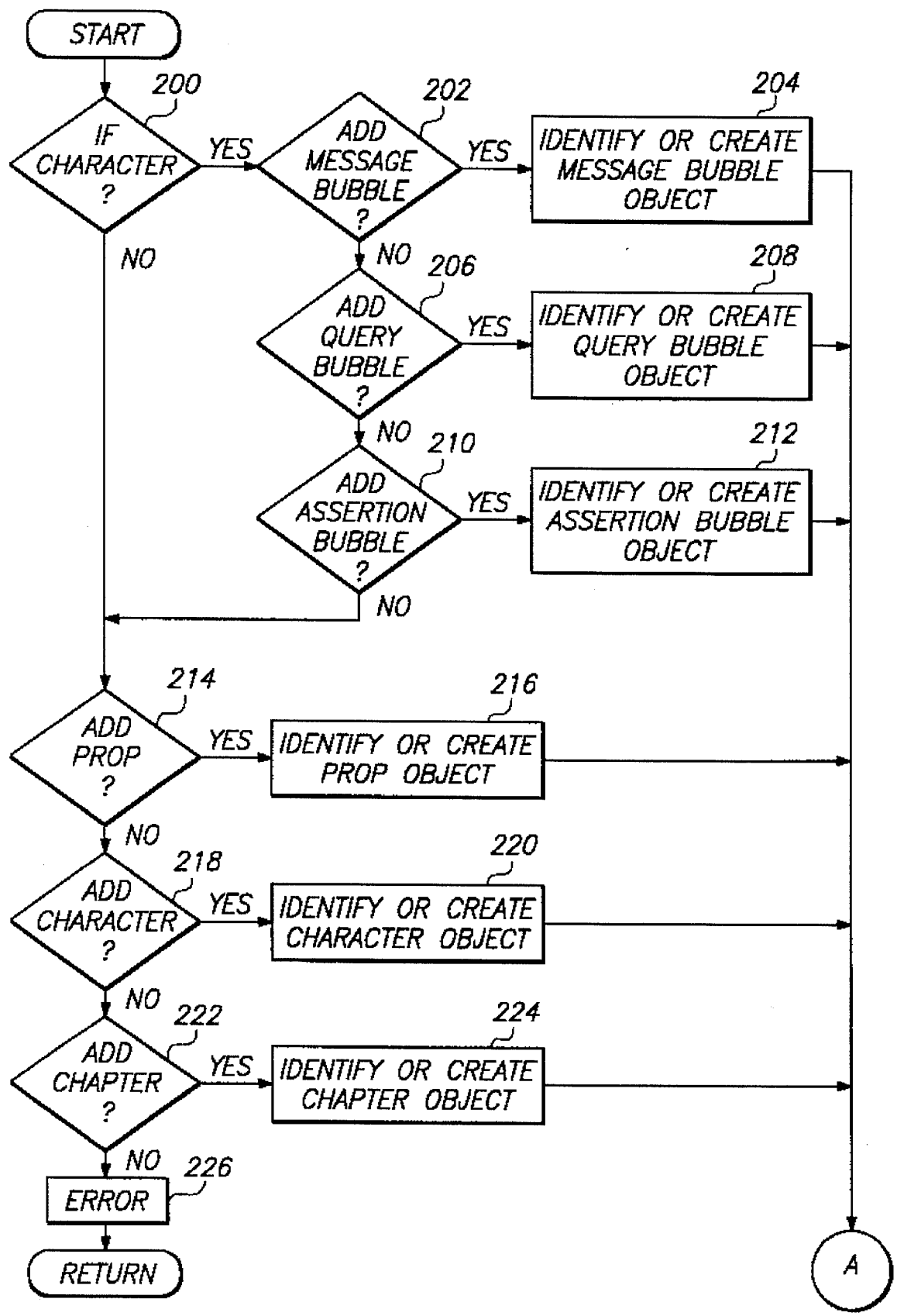
FIGS. 10A & 10B are a flow charts showing the preferred method for placing an object in a cell.
Figure 10B:
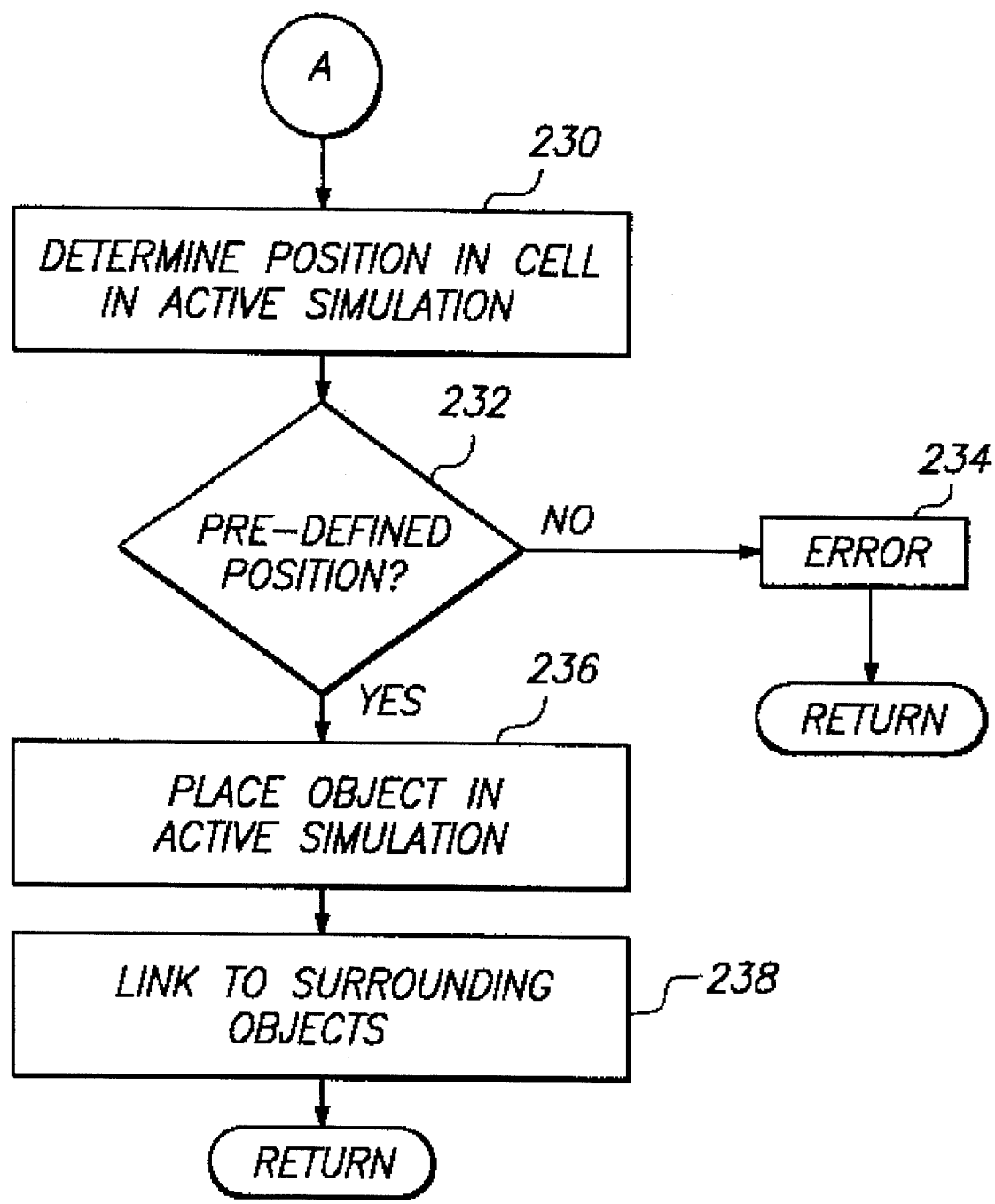

Referring now to FIGS. 10A & 10B, a flow chart of the preferred method for placing an object in a cell object (step 170 of FIG. 9) is shown. The preferred method for placing an object in a cell begins in step 200, where the authoring editor 36 determines if there already is at least one character object in the cell object. The present invention tests for character objects because query bubble objects, assertion bubble objects, and message bubble objects may only be added to a cell object that already has one or more character objects in the cell object. If the authoring editor 36 determines that there is at least one character object already in the cell object, the authoring editor 36 proceeds to step 202 where it determines if the input object is a message bubble object. If the input object is a message bubble object, the authoring editor 36 proceeds to step 204 where it either: 1) creates a new message bubble object if the author created a new message bubble object or 2) identifies the existing message bubble object that is to be modified in position or modified in the data it includes. The authoring editor 36 then proceeds to step 230 of FIG. 10B.

If in step 202, the input object is not a message bubble object, the authoring editor 36 tests in step 206 if the input object is a query bubble object. If in step 206, the object is a query bubble object, the authoring editor 36 proceeds to step 208 where it creates a new query bubble object if the author selected creation of a new query bubble object during the input step 162 or identifies the existing query bubble object that was modified during the input step 162. The authoring editor 36 then moves to step 230 of FIG. 10B.

Should the authoring editor 36 determine in step 206 that the object is not a query bubble object, it tests in step 210 if the object is an assertion bubble object. If the object is an assertion bubble object, the authoring editor 36 creates a new assertion bubble object if the author selected creation of a new assertion bubble object during the input step 162 or identifies the existing assertion bubble object that was modified during the input step 162, and continues at step 230 of FIG. 10B.

If in step 210 the object is not an assertion bubble object, the authoring editor 36 proceeds to step 214. The authoring editor 36 may reach step 214 from either step 200 or step 210. At step 214, the authoring editor 36 determines if the input object is a prop object, a run time prop object, or a scroll object. If the input object is a prop object, a run time prop object, or a scroll object, the authoring editor 36 proceeds to step 216 and creates a new prop object if the author selected creation of a prop object during the input step 162, or identifies the existing prop object that was modified during the input step 162. After step 216, the method continues at step 230 of FIG. 10B. If the object was determined in step 214 not to be a prop object, then the authoring editor 36 determines if the input object is a character object in step 218. If the input object is found to be a character object, the authoring editor 36 creates a new character object if the author selected creation of a character object during the input step 162, or identifies the existing character object that was modified during the input step 162 in step 220, and then the method continues at step 230 of FIG. 10B. If it is not a character object in step 218, the authoring editor 36 proceeds to step 222 where it determines if the object is a chapter object. If the object is a chapter object, the authoring editor 36 creates a new chapter object if the author selected creation of a chapter object during the input step 162, or identifies the existing chapter object that was modified during the input step 162 in step 224. Then, the method continues to step 230 of FIG. 10B. If in step 222 the object is not a chapter object, an error has occurred. The authoring editor 36 issues an error message in step 226 and the method is complete.

Referring now to FIG. 10B, the preferred method for updating the active simulation memory 28 for a new or modified object is shown. In step 230, the authoring editor 36 determines the position within the cell object in the active simulation memory 28 that corresponds to the coordinates input from the input device 24. Since objects that appear during the editing mode within a cell icon 50 will be executed by the engine 42 in order from left to right according to their position in the cell icon 50, the method must identify the location of the object to be modified or created with respect to other objects, if any, that may also be in the cell object. This allows the authoring editor 36 to properly place the new or modified object in the active simulation memory 28 in a position that corresponds to the icons displayed by the authoring editor 36 on the output device 16 when the system 10 is in the editing mode. In step 230, a further refinement of the determination of location in the active simulation is made as compared with the determination of location made in step 164. Next, in step 232, the authoring editor 36 determines if the ending position of the object matches a pre-defined position for the object. The system 10 advantageously contains a set of rules that set out the pre-defined positions where an object may be legally placed. For example, there may only be one prop object in a cell object and the prop object must be placed at the end of the cell object. Within a cell object, there may be no character objects after a prop object. A query bubble object, an assertion bubble object, or a message bubble object must be in close proximity to a character object so as to be associated with that character object. Moreover, there is preferably no more than one query bubble object, one assertion bubble object, and/or one message bubble object associated with a character object. An object may not be added to a cell 50 that already contains a chapter 51. A chapter object may only be alone in the cell object. If in step 232 the position input does not match pre-defined positions in the active simulation memory 28 for the object, the authoring editor 36 issues an error statement in step 234 and the method ends.

If in step 232, the ending position is found to fit within a pre-defined position for the object, the authoring editor 36, in step 236, breaks any links that may exist between the objects that surround the chosen ending position in the active simulation memory 28 and places the new or modified object in that ending position in the active simulation memory 28. The authoring editor 36 then, in step 238, establishes new links between the added object and the objects before and after it in the active simulation memory 28. The links will show the engine 42 the path of the simulation. If the object is being moved, the links for its beginning position must be similarly broken and re-established to remove the object from its previous position in the active simulation memory 28. The authoring editor 36 then returns from placing an object in a cell object.

Figure 11:
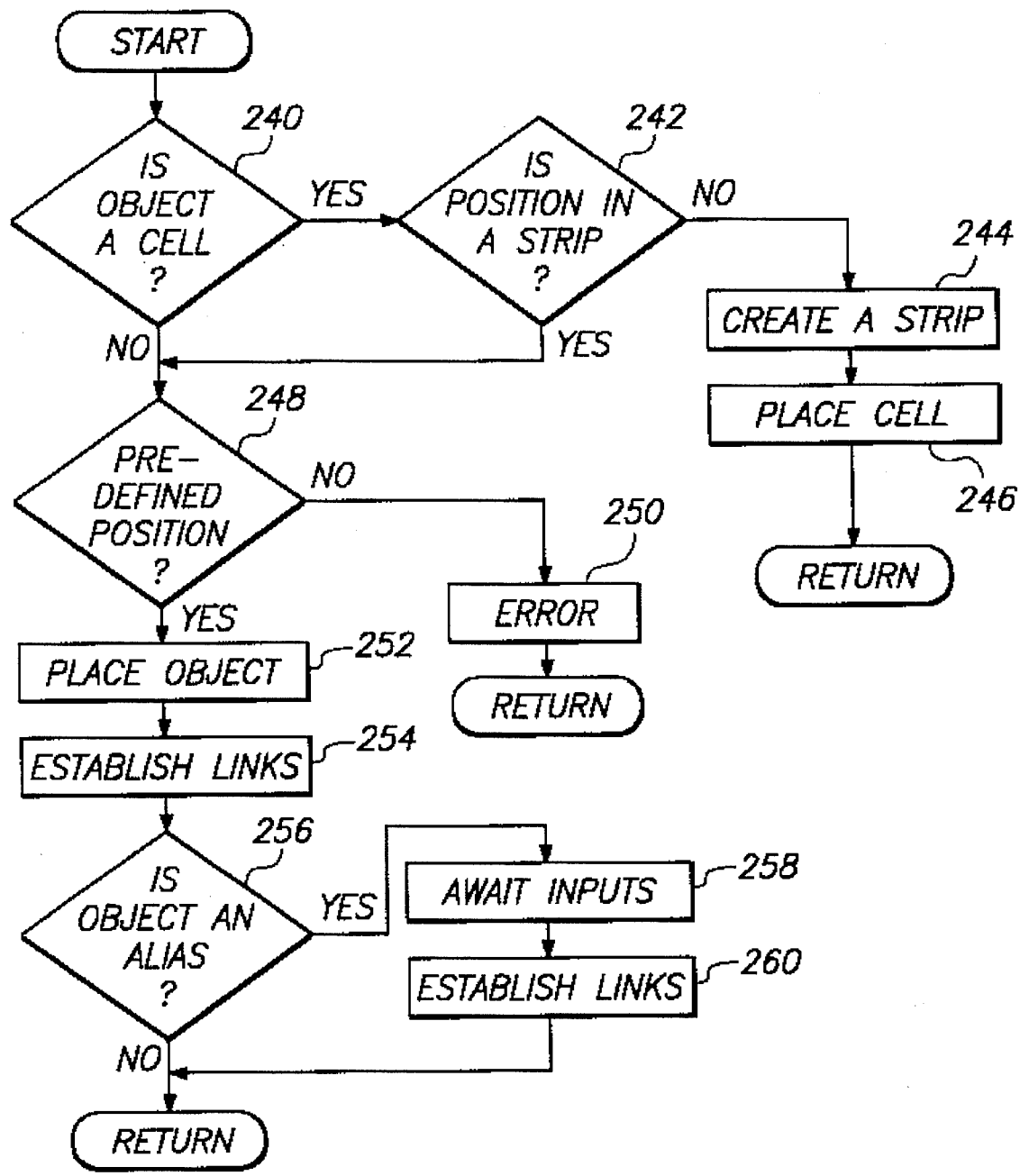
FIG. 11 is a flow chart showing the preferred method for placing an object among cells.

Referring now to FIG. 11, a flow chart of the preferred method for placing objects into the active simulation memory 28, but outside a cell object (Step 172) is shown. The method for placing objects outside a cell object begins in step 240 with the authoring editor 36 determining if the object is a cell object. If the object is a cell object, the authoring editor 36 proceeds to step 242 where it tests whether the position in the active simulation memory 28, which corresponds to the coordinates of the point at which the author dropped the cell icon 50, is within a strip object. If in step 242 the point is not in a strip object, the authoring editor 36 creates a new strip object in step 244 and stores the new strip object in the active simulation memory 28 at a location corresponding to the position where the cell icon 50 was dropped. The authoring editor 36 creates the strip object in the chapter object, or in the chapter object and branch object, in which the cell object is to be placed. The authoring editor 36 links the new strip object to the existing strip objects whose strip icons 44 appear above and below it in the authoring user interface 37. The authoring editor 36 then places the cell object into the new strip object in step 246 and returns from placing the object.

If in step 242, the cell object is found to be placed in a pre-existing strip object or if in step 240, the object is found not to be a cell object, the authoring editor 36 proceeds to step 248, where it determines if the position in the active simulation memory 28 is a pre-defined position for the object to be added or modified. In step 248, the present invention limits the location where objects other than a cell object may be placed. Objects other than a cell object must be positioned next to or between other objects in a strip object. If in step 248 the position where the object is to be placed does not match a pre-defined position, the authoring editor 36 outputs an error message in step 250 and returns from placing the object. If the position matches the pre-defined position for the object type, the authoring editor 36, in step 252, breaks the links between the existing objects that are already placed around the ending position at which the current object is to be placed, and places the current object at the position. The authoring editor 36 then establishes new links between the placed object and the existing objects in step 254. If the object that was just placed is an alias object, the authoring editor 36 executes an extra step when placing the alias object into the active simulation memory 28. In step 256, the authoring editor 36 determines if the object was an alias object. If the object is not an alias object, the authoring editor 36 returns from placing objects. If the object was an alias object, the authoring editor 36 proceeds to step 258 where it waits for an input from the author. When the author places an alias object into the active simulation memory 28 the author must also specify the cell object that the alias object is to represent. The author does this by clicking on the cell icon 50 and dragging a representation of the cell icon 50 to the alias icon 84. When the author has input the cell object that the alias object represents, the authoring editor 36, in step 260, establishes a link between the alias object and the cell object that it represents. The authoring editor 36 then returns from placing objects.

Figure 12:
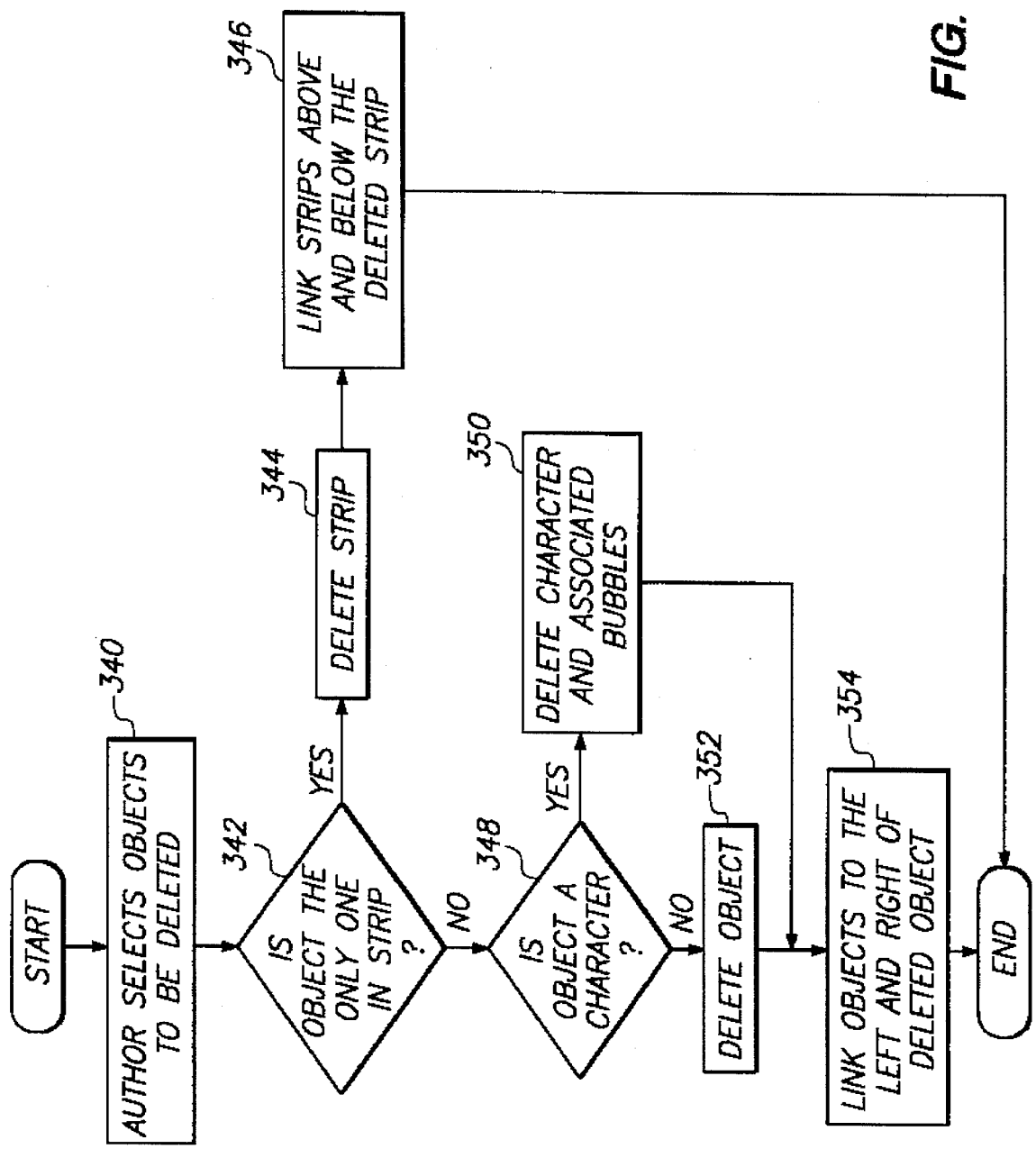
FIG. 12 is a flow chart showing the preferred method for deleting objects from a simulation.

Referring now to FIG. 12, a flow chart showing the preferred method for deleting objects from the active simulation memory 28 is shown. Using the conventional Macintosh System 7.1 user interface, the author may select one or more objects to be deleted. For each object to be deleted the steps of the flow chart of FIG. 12 are performed. The author first specifies the object(s) to be deleted by clicking on the icon corresponding to the object and entering a delete command in step 340. Deleting an object, such as a cell object or chapter object, preferably deletes all objects contained within that object. In step 342, the preferred method tests whether the object is the last object in the strip object. If there are additional remaining objects in the strip object, then the method continues in step 348.

If, however, the object to be deleted is the last object in the strip object, then the method proceeds to step 344 where the strip object is deleted. Whenever an object is deleted, the authoring editor 36 updates the authoring user interface 37 by removing the corresponding icons from the output device 16. The authoring editor 36 then, in step 346, links the strip objects whose strip icons 44 were above and below the deleted strip icon 44 as displayed in the authoring user interface 37 on the output device 16. The method is complete and then ends. In step 348, the authoring editor 36 determines if the object to be deleted is a character object. If the object is a character object, the authoring editor 36 proceeds to step 350 where it deletes the character object and any associated message bubble object, query bubble object, or assertion bubble object from the active simulation memory 28. Once again, the authoring editor 36 updates the authoring user interface 37. The authoring editor 36 also deletes any non-global grammar object that was associated with a deleted message bubble object from the message bubble memory 32. If in step 348 the object is not a character object, the authoring editor 32 proceeds to step 352 where it deletes the specified object. In step 354, the authoring editor 36 updates the links between objects before and after the deleted object in the active simulation memory 28. The method is now complete.

Figure 13:
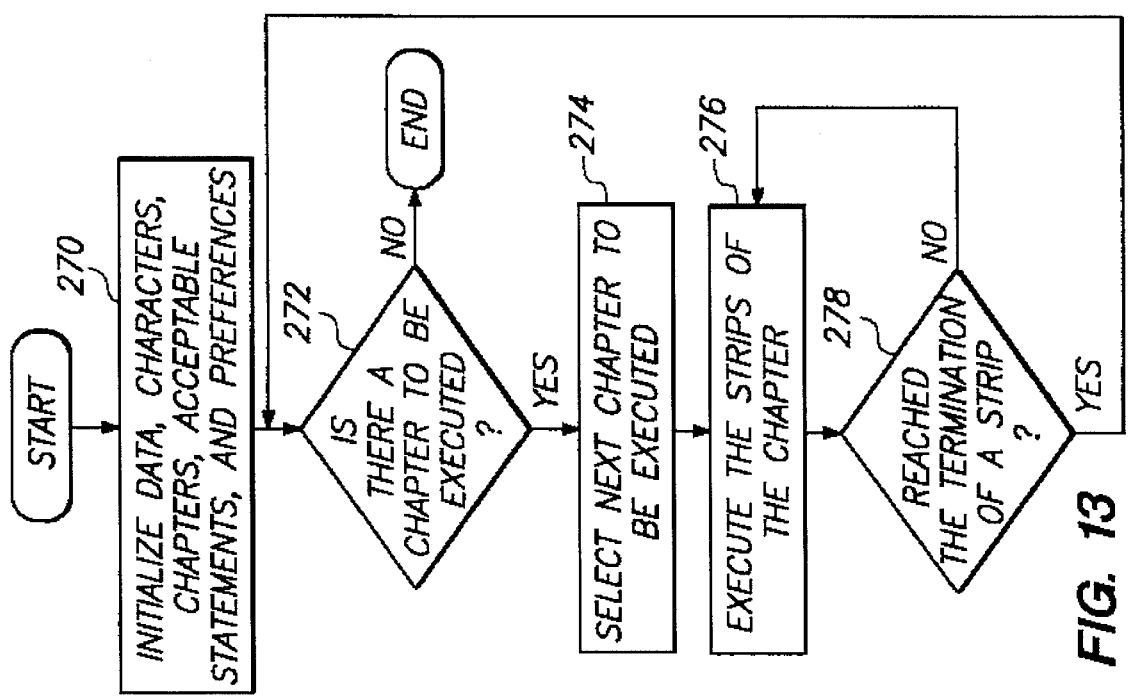
FIG. 13 is a flow chart showing the preferred method for executing a simulation.

Referring now to FIG. 13, a flow chart of the preferred method for executing a simulation is shown. The simulation stored in the active simulation memory 28 is preferably retrieved and executed by the engine 42. The author need not complete the simulation before executing what has already been created. The engine 42 may advantageously execute the active simulation memory 28 at any time including during the authoring process. This lets the author create a portion of a simulation and test immediately whether the simulation executes as the author intended.

The preferred method for executing a simulation begins in step 270 where the engine 42 initializes all character objects, chapter objects, grammar objects, and preferences. The preferences identify the first chapter object that is to be executed. The grammar objects are preferably stored in the message bubble memory 32 and referenced by the message bubble object that utilizes them. In step 272, the engine 42 determines the next chapter object to execute. There is preferably one chapter object that contains the entire simulation. At the start of the simulation, the chapter object first executed will be the chapter object indicated in the preferences as the first chapter object. During the simulation, the next chapter object will be simply the next chapter object indicated in the simulation path in the active simulation memory 28. If in step 272 there is no next chapter object, the simulation is over and the method ends. If a chapter object is found to exist in step 272, the engine 42 selects, in step 274, the next chapter object to be executed. Next in step 276, the engine 42 executes all strip objects of the chapter object in parallel. The engine 42 begins the execution by attempting to execute the first object of the first strip object in the chapter object. The engine 42 continues to execute the objects of the first strip object until it fails to execute an object. The engine 42 then attempts to execute the objects of the next strip object in the chapter object. As with the first strip object, the engine 42 continues to execute the objects of the second strip object until it fails to execute an object. The engine 42 rotates through each succeeding strip object of the chapter object in this manner. When the engine 42 fails to execute an object in the last strip object of the chapter object, the engine 42 returns to the first strip object and attempts to execute the object that it earlier failed to execute. The engine 42 does not necessarily execute the strip objects evenly. When the engine 42 reaches the end of a strip object, the engine 42 determines, in step 278, if it should terminate execution of the chapter object. If the engine 42 should not terminate execution of the chapter object, the engine 42 returns to step 276 to continue execution of the current strip object or another strip object according to the prop objects or the layout of the strip objects in the active simulation memory 28. The decision of the engine 42 in step 278 will be based in part upon whether or not there is a prop object that indicates the end of the chapter object at the end of that strip object. If it is determined, however, that the end of the chapter object has been reached, the method continues to step 272 and tests whether there are any additional chapter objects that must be processed by the processor 18 under control of the engine 42.

Figure 14:
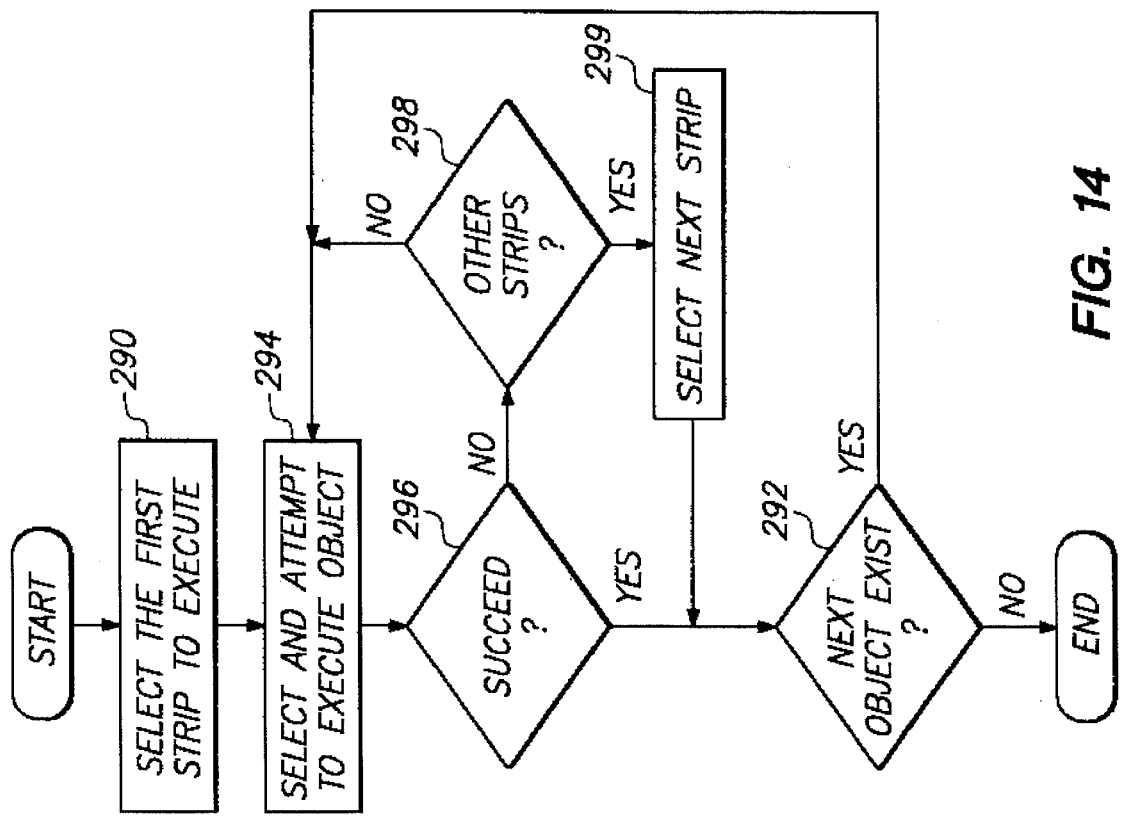
FIG. 14 is a flow chart showing the preferred method for executing strips within a simulation.

Referring now to FIG. 14, a flow chart showing the preferred method for executing the strip objects of a chapter object is shown. There is at least one strip object in each chapter object or branch object. A strip icon 44 may contain any other object. Beginning in step 290, the preferred method for executing strip objects selects, from the active simulation memory 28, the first strip object to be executed. The engine 42 attempts to execute the next object in the strip object in step 294. In step 296, the engine 42 determines if it was successful in executing the object. If the engine 42 was successful in executing the object, the engine 42 determines, in step 292, if there is another object in the strip object to be executed. If there is no object, the engine 42 stops execution of the strip object. If there is an object to be executed, the engine 42 proceeds to step 294 where it selects the next object and attempts to execute it. If, in step 296, the engine 42 did not succeed in the execution of the object, the engine 42 proceeds to step 298 and determines if there are other strip objects in the chapter object. If, in step 298, other strip objects are found to exist, the engine 42 selects, in step 299, the next strip object and proceeds to step 292 to execute this strip object. If in step 298 no other strip objects are found to exist, the method continues to step 294 and attempts to execute the object, that the engine 42 failed to execute, again.

Figure 15:
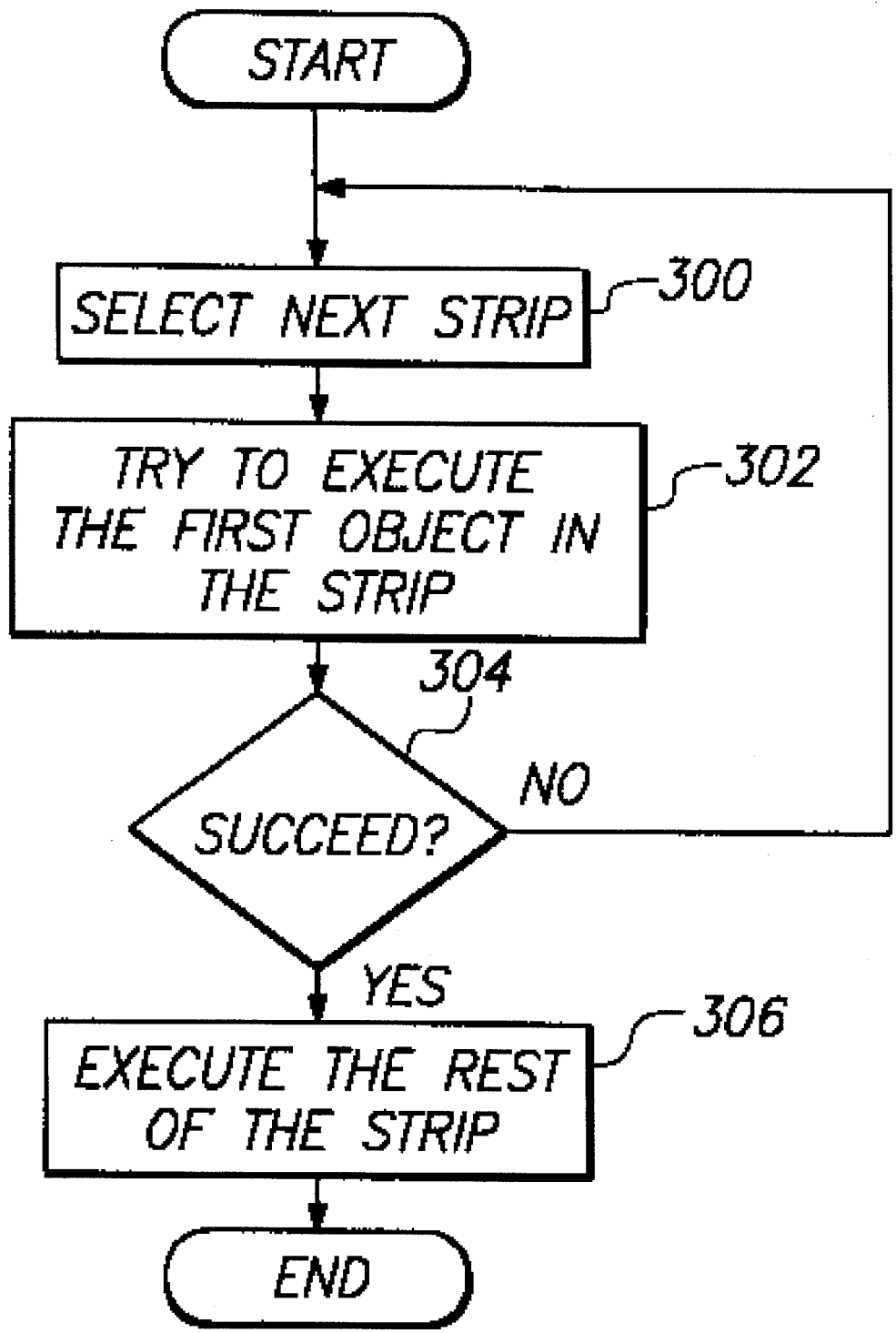
FIG. 15 is a flow chart showing the preferred method for executing branches within a simulation.

Referring now to FIG. 15, a flow chart of the preferred method of executing a branch object is shown. A branch object requires special execution. A branch object comprises a plurality of strip objects that provide alternate paths of execution for the engine 42. In a branch object, the engine 42 selects one strip object and executes only that strip object. Beginning in step 300, the engine 42 selects the next strip object of the branch object from the active simulation memory 28. The engine 42 starts with the first strip object of the branch object. In step 302, the engine 42 attempts to execute the first object in the first cell object of the strip object. Generally, this object will be a query bubble object associated with a character object. The engine 42 then, in step 304, determines if the first object was successfully executed. If the engine 42 did not succeed in executing the object, the engine 42 returns to step 300 to select the next strip object of the branch object. The engine 42 will continue to test the first object in each strip object until an object has been successfully executed. The engine 42 will then continue with the execution of the remainder of that strip object. If the engine 42 succeeded in step 302, the engine 42 proceeds to step 306 where it continues the execution of the rest of the strip object. The engine 42 effectively ignores the other strip objects during the execution of the selected strip object.

Figure 16:
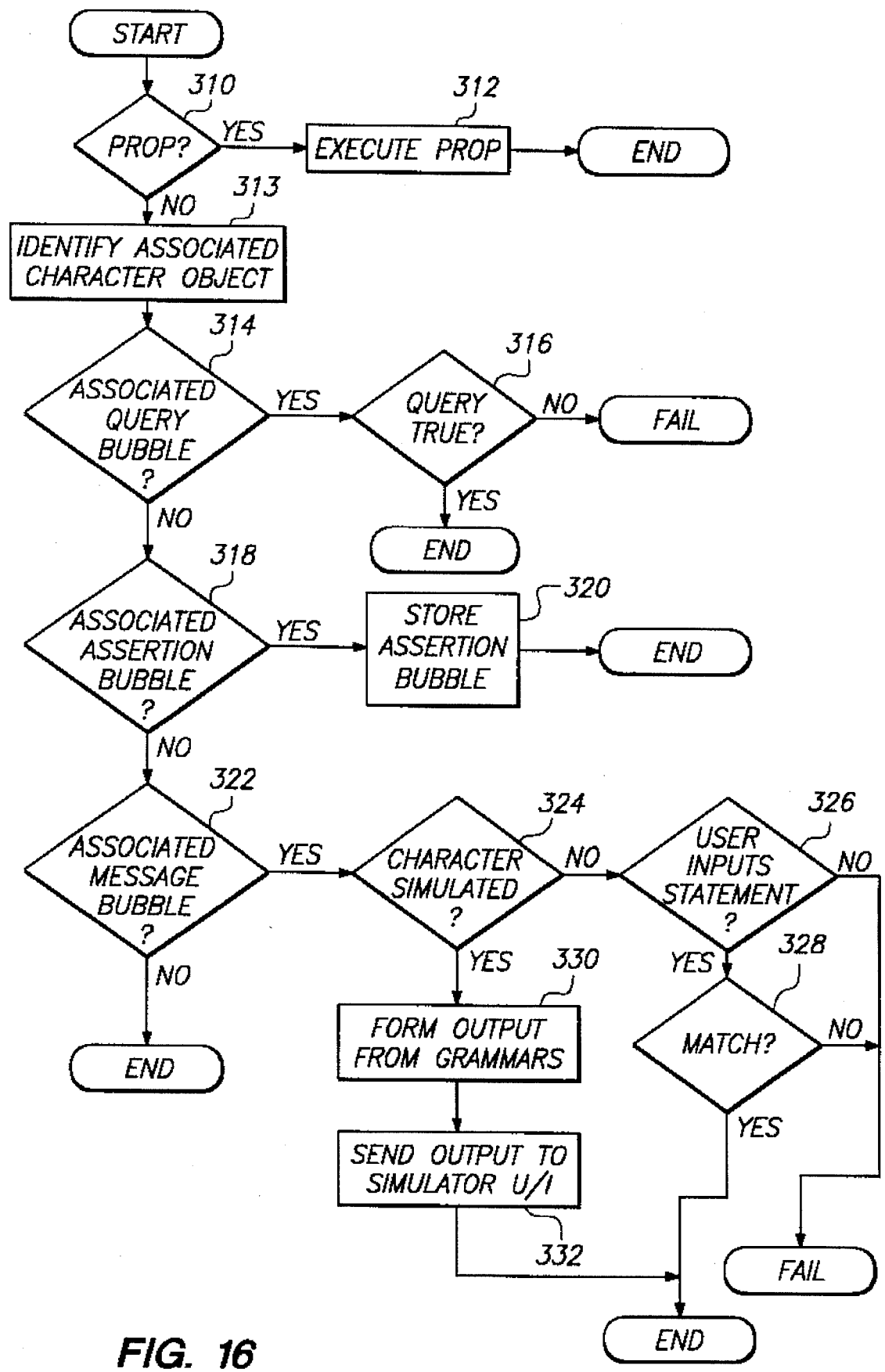
FIG. 16 is a flow chart showing the preferred method for executing objects within a simulation.

Referring now to FIG. 16, a flow chart of the preferred method for executing character objects, message bubble objects, assertion bubble objects, query bubble objects, scroll object, prop objects, and run time prop objects is shown. While scroll objects, prop objects, and run time prop objects may be placed outside cell objects, this method applies to these objects whether or not they are inside or outside a cell object.

Beginning in step 310, the engine 42 determines if the object is a prop object, a run time prop object, or a scroll object. If the object is a prop object, a run time prop object, or a scroll object, the engine 42 proceeds to step 312 to execute the object. The engine 42 executes a prop object by moving to the point in the active simulation memory 28 that is indicated by the prop 54. If the prop object is "The End," the engine 42 ends execution of the chapter object and selects the first cell object of the first strip object of the next chapter object to be executed. If the prop object is "This Strip Again," the engine 42 selects the first cell object of the current strip object. If the prop object is "Dead End," the engine 42 stops execution of the current strip object but continues execution of the other strip objects of the chapter object. If the prop object is "This Chapter Again," the engine 42 executes the strip objects of the chapter object from the beginning of each strip object. If the prop object is "This Cell Again," the engine 42 selects the current cell object and executes it again from the first object in the cell object. If the engine 42 is executing a run time prop object, the engine 42 ceases executing objects in the strip object for the period of time indicated by the run time prop object. When the time period is over, the engine 42 restarts with the next object after the run time prop object in the active simulation memory 28. If the engine 42 is executing a scroll object, the engine 42 sends the text contained in the scroll object to the simulation U/I 48 for display on the output device 16. The engine 42 then continues the execution of the strip object.

Once the engine 42 has completed the execution of the prop object, the run time prop object, or the scroll object and the execution of the object is successful, the method ends.

If in step 310 the object is not a prop object, run time prop object, or scroll object, the object must be a character object. Message bubble objects, query bubble objects, and assertion bubble objects preferably do not exist on their own; they must be associated with a character object. Next, in step 313, the engine 42 identifies the character object associated with the query bubble object, assertion bubble object, or message bubble object. The engine 42 then determines, in step 314, if the identified character object has a query bubble object associated with it. If the character object has an associated query bubble object, the engine 42 tests, in step 316, if the query is true. The engine 42 determines if the query is true by applying the rules table 34 to the assertion memory 30 by means of the inference engine of the engine 42. If the query is not true, the execution of the object fails and the method ends. If the query is true, the execution of the object is successful and the method ends.

If in step 314 the identified character object is found not to have an associated query bubble object, the engine 42 determines in step 318 if there is an associated assertion bubble object. If there is an associated assertion bubble object, the engine 42, in step 320, stores the fact concerning the character object, and a reference to the identified character object, in the assertion memory 30. The engine 42 has then successfully executed the character object and the assertion bubble object, and the method ends.

If, in step 318, the identified character object is found not to have an assertion bubble object associated with R, the engine 42 determines, in step 322, if there is an associated message bubble object. If there is no associated message bubble object, the character object simply appears in the cell object but does nothing and there is nothing for the engine 42 to output. The engine 42 has successfully executed the object and the method ends. If there is an associated message bubble object, the engine 42 next determines if the identified character object is simulated in step 324. If the character object is simulated, the engine 42 forms the statement, in step 330, for the character object by navigating a path through the key word objects, grammar objects, and acceptable statement objects referenced by the message bubble object. The engine 42 then, in step 332, sends the statement it has generated to the simulation U/I 48 for outputting on the output device 16. The engine 42 has now successfully executed the object, and the method ends. If in step 324 the character object is not simulated, the engine 42 proceeds to step 326 where the engine 42 determines if the user has input a statement. If the user does not input a statement in the allotted time, the execution of the object fails, and the method ends. If in step 326 the user has input a statement, the engine 42 compares the statement to the acceptable statement objects of the grammar object referenced by the message bubble object, in step 328. If there is a match, the execution of the object is successful and the method ends. If in step 328 there is not a match, the execution of the object was not successful, and the method ends.

While the present invention has been described with reference to certain preferred embodiments, those skilled in the art will recognize that various modifications may be provided. For example, languages other than English may be used with the present invention, or other characters, representing animals, inanimate objects, or machines, may be added to the plurality of icons. Moreover, the characters objects may be constructed in an object oriented manner so that assertions and states are stored with each character object rather than in the assertion memory 30 and message bubble memory 32. These and other variations upon and modifications to the preferred embodiments are provided for by the present invention, which is limited only by the following claims.

What is claimed is:

1. In a computer system having an input device, an output device and a processor, an apparatus for creating and executing an interactive simulation, the apparatus comprising:

an active simulation means for storing a plurality of simulation objects representing the interactive simulation;

an authoring editor means for modifying the objects in the active simulation means and for producing an authoring user interface on the output device in a creating mode, the authoring user interface providing a comic book layout having a plurality of cells and including graphical images representing each object, the authoring editor means coupled to the active simulation for storing objects in an executable order corresponding to a position of the objects when displayed in the authoring user interface, the authoring editor means coupled to the input device to receive input during the creating mode, and the authoring editor means coupled to the processor to produce the authoring user interface on the output device;

an engine for executing the interactive simulation by processing the simulation objects stored in the active simulation, the engine performing a computer program step sequence associated with each object and determining a next object to execute, the engine coupled to the active simulation; and a simulation user interface means for controlling the processor to generate an output on the output device in response to signals from the engine in an execution mode, the simulation user interface means coupled to the engine.

2. The apparatus of claim 1, wherein the simulation objects include a character object representing a person or thing in the simulation, a message bubble object representing an input or output statement by an associated character object, and a prop object indicating the next object to be processed by the engine.

3. The apparatus of claim 2, wherein each message bubble object includes a grammar object storing a statement, a key word and text.

4. The apparatus of claim 3 further comprising a message bubble memory for storing a grammar object, the message bubble memory coupled to the engine for constructing outgoing statements and for analyzing incoming statements against the grammar object, the message bubble memory coupled to the authoring editor means for creating and modifying the grammar object.

5. The apparatus of claim 2, wherein the simulation objects also include:

a query bubble object for presenting a question about a fact related to a character object; and an assertion bubble object representing a fact relating to a character object in the simulation.

6. The apparatus of claim 5 further comprising an assertion memory for storing a statement of fact made about a character object and a reference to a character in response to the execution of an assertion bubble object by the engine.

7. The apparatus of claim 6 further comprising:

a rules table for storing rules that the engine uses to answer a a question referenced by a query bubble object; and wherein the engine includes an inference engine for analyzing a question referenced by a query bubble object, the inference engine using data stored in the assertion memory, and the rules table to execute a query bubble object.

8. The apparatus of claim 5, wherein the authoring user interface has a comic book form, the icon representing a cell object is a rectangular frame, the icon representing a chapter object is a square with a title of the chapter object displayed in the center of the square, the icon representing a strip is a rectangular shaded region, the icon representing a cell is a rectangular box, the icon representing a bubble object is an oval with a protrusion, and the icon representing a character object is a cartoon like image.

9. The apparatus of claim 5, further comprising a means for generating a message bubble interface for creating a grammar object, the generating means displaying a window for organizing statements, keywords, alternate keywords and other grammar objects.

10. The apparatus of claim 2, wherein the simulation objects also include:

a chapter object for grouping one or more objects for display in the creation mode and for execution of one or more objects in the execution mode;

a strip object for displaying one or more objects adjacently from left to right in the creation mode and for grouping one or more objects for successive execution in the execution mode;

a branch object for displaying one or more objects adjacently from top to bottom in the creation mode and for grouping one or more objects for alternative execution in the execution mode; and a cell object for displaying one or more objects as a group in the creation mode.

11. The apparatus of claim 2, wherein the prop objects include:

an end of chapter prop indicating an end of chapter and directing the engine to execute the next cell object in the active simulation means;

a re-execute strip prop directing the engine to re-execute a current strip object beginning with a first object in the current strip;

a re-execute all strips prop directing the engine to re-execute all strip objects of the current chapter object;

a re-execute cell prop directing the engine to re-execute a current cell object;

a wait for completion prop for directing the engine to wait at an end of the strip object for the completion of one of the other strip objects;

a run time prop for directing the engine to pause execution of a strip object for a fixed period of time; and a scroll prop for directing the engine to display text through the simulation user interface.

12. The apparatus of claim 1 further comprising:

a memory for icons representing objects, and video and sound data corresponding to objects;

wherein the authoring editor means retrieves icons and data from the memory for icons, and displays the retrieved icons and data in the authoring user interface; and wherein the simulation user interface means retrieves video and sound data for output on the output device in response to the signals from the engine.

13. The apparatus of claim 1, wherein the authoring user interface provides an authoring region for positioning icons representing objects forming the simulation and a button region providing a plurality of buttons, each button for creating an instance of an object.

14. The apparatus of claim 13, wherein the plurality of buttons include:

a cell button for creating an instance of a cell object, the authoring editor storing the cell object in the active simulation means and displaying an associated cell icon in response to selection of the cell button;

a chapter button for creating an instance of a chapter object, the authoring editor storing the chapter object in the active simulation means and displaying an associated chapter icon in response to selection of the chapter button;

a character button for creating an instance of a character object, the authoring editor storing the character object in the active simulation means and displaying an associated character icon in response to selection of the character button;

a query bubble button for creating an instance of a query bubble object, the authoring editor storing the query bubble object in the active simulation means and displaying an associated query bubble icon in response to selection of the query bubble button;

an assertion bubble button for creating an instance of an assertion bubble object, the authoring editor storing the assertion bubble object in the active simulation means and displaying an associated assertion bubble icon in response to selection of the assertion bubble button;

a message bubble button for creating an instance of a message bubble object, the authoring editor storing the message bubble object in the active simulation means and displaying an associated message bubble icon in response to selection of the message bubble button; and a prop button for creating an instance of a prop object, the authoring editor storing the prop object in the active simulation means and displaying an associated prop icon in response to selection of the prop button.

15. A computer implemented method for creating an interactive simulation having a plurality of objects, the method comprising the steps of:

displaying an authoring user interface with a comic book format and having a plurality of cells on an output device;

receiving input from an input device, the input including a create new object command at an input position;

converting the input into a first object using an authoring editor means, the object being one from the group of a character object, a prop object, a message bubble object, a query bubble object, and an assertion bubble object;

determining a location in the active simulation corresponding to the input position; and storing the first object in an active simulation at the determined location, using the authoring editor means; and updating the display of the authoring user interface to represent the objects and data stored in the active simulation.

16. The computer implemented method of claim 15, further comprising the steps of:

displaying an initialization screen on the output device;

accepting initialization input including a chapter object and a character object from the input device;

storing the character object, an associated name and a character icon in the active simulation;

displaying the associated name and character icon in the initialization screen;

storing the chapter object and a chapter name in the active simulation;

displaying the chapter name in the initialization screen; and identifying a first chapter to be executed.

17. The computer implemented method of claim 15, wherein the input includes a modify object command, a beginning position and an ending position;

wherein the method further comprises the steps of determining a beginning location in the active simulation corresponding to the beginning position, and determining an ending location in the active simulation corresponding to the ending position; and wherein the step of storing removes the object from the beginning location in the active simulation and stores the object at the ending location in the active simulation.

18. The computer implemented method of claim 15 further comprising the steps of:

determining whether the object is a cell object;

determining whether the location is positioned within a strip object; and creating a new strip object if the object is a cell object and the location is not within a strip object.

19. The computer implemented method of claim 15 further comprising the steps of:

determining if the location matches a pre-defined position for the object;

creating new links between existing objects in the simulation and storing the object in the active simulation if the location matches a pre-defined position for the object.

20. The computer implemented method of claim 19 further comprising the steps of:

determining whether the object is an alias object;

receiving a reference to an existing cell object if the object is an alias object;

storing the reference to the existing cell object with the object in the active simulation if the object is an alias object.

21. The computer implemented method of claim 15 further comprising the steps of:

determining a location in the active simulation at which the object is to be stored;

determining whether the location in the active simulation matches one of a plurality of pre-defined locations for the object;

storing the object at the location in the active simulation if the location matches a pre-defined position for the object; and linking the object to existing objects positioned proximate the location in the active simulation.

22. The computer implemented method of claim 21, wherein the step of determining whether the corresponding location matches a pre-defined location for the object comprises the steps of:

determining whether a prop object is stored in the cell for the corresponding location if the object is a prop object;

determining whether an associated character object exists, if the object is a message bubble object, a query bubble object, or an assertion bubble object;

determining whether a message bubble object, a query bubble object, or an assertion bubble object exists if the object is a message bubble object, a query bubble object, or an assertion bubble object;

determining whether a cell already contains a chapter; and issuing an error statement if any of the determining steps are found to be true.

23. The computer implemented method of claim 15, wherein the step of converting further comprises the sub-steps of:

determining whether the input provides an associated character object;

determining whether the input is an add message bubble command;

creating a message bubble object with the authoring editor if the input is an add message bubble command and the input identifies the associated character;

determining whether the input is an add query bubble command;

creating a query bubble object with the authoring editor if the input is an add query bubble command and the input identifies the associated character;

determining whether the input is an add assertion bubble command;

creating a assertion bubble object with the authoring editor if the input is an add assertion bubble command and the input identifies the associated character;

determining whether the input is an add prop command;

creating a prop object with the authoring editor if the input is an add prop command;

determining whether the input is an add character command;

creating a character object with the authoring editor if the input is an add character command;

determining whether the input is an add chapter command; and creating a chapter object with the authoring editor if the input is an add chapter command.

24. The computer implemented method of claim 15, wherein the step of converting further comprises the sub-steps of:

determining whether the input is a modify existing object command; and identifying the object to modify if the input is a modify existing object command.

25. The computer implemented method of claim 15, wherein the input from the receiving step identifies a specified object and a delete function, and wherein the step of converting the input comprises the sub-steps of:

determining whether the specified object is a last object in its respective strip;

deleting the strip if the specified object is the last object in its respective strip;

determining whether the specified object is a character object;

deleting any message bubble objects, query bubble objects and assertion bubble objects associated with the specified object if the specified object is a character object;

deleting the specified object from the active simulation; and linking a first object in the active simulation to the a second object in the active simulation, the first and second objects having locations proximate the specified object.

26. A computer implemented method for executing an interactive simulation having a plurality of objects, the method comprising the steps of:

retrieving objects representing a simulation from an active simulation memory;

identifying a chapter object to be executed, the chapter object having at least one associated object;

identifying objects associated with the identified chapter object; and executing the associated objects according to their order in the active simulation memory by performing a sequence of programmed instruction steps corresponding to each object to produce output signals and processing the output signals to generate the interactive simulation on an output device, said step of executing including determining whether the associated object is a query bubble object; identifying a character object associated with the associated object; retrieving a query corresponding to the object if the object is a query bubble object; and determining whether the query is true by applying a rules table to an assertion memory by means of an inference engine, if the object is a query bubble object.

27. The method of claim 26, wherein the step of executing the associated objects according to their order in the active simulation memory further comprises the sub-steps of:

identifying a strip object grouping the associated objects;

selecting a current object in the strip;

attempting to execute the current object in the strip;

determining whether execution was successful;

determining whether another object exists in the strip object;

repeating the above steps for a next object if another object exists in the strip object and the execution was successful; and selecting a next strip and repeating the above steps with the next strip if execution was not successful.

28. The method of claim 26, wherein the step of executing the associated objects according to their order in the active simulation memory further comprises the sub-steps of:

determining whether the associated objects are grouped together by a branch object;

identifying a strip object within the branch object;

selecting the strip object;

attempting to execute a first object in the strip object;

determining whether execution of the first object was successful;

executing a second object in strip object if the execution of the first object was successful; and repeating the above steps of selecting, attempting, determining, and executing for the next strip within the branch object if the execution of the first object was not successful.

29. The method of claim 26, wherein the step of executing the associated objects further comprises the sub-steps of:

determining whether the object is an assertion bubble object;

identifying a character object associated with the object;

retrieving an assertion corresponding to the object if the object is an assertion bubble object; and storing the assertion and a reference to the associated character object in an assertion memory, if the object is an assertion bubble object.

30. The method of claim 26, wherein the step of executing the associated objects further comprises the sub-steps of:

determining whether the object is a message bubble object; and if the object is a message bubble object, identifying a character object associated with the object;

determining whether the object is to be simulated;

if the object is to be simulated, forming an output signal using a grammar object and sending the output signal to a simulation user interface; and if the object is not to be simulated, comparing inputs to a grammar object and sending a signal to an engine indicating whether the inputs matched the grammar object.

* * * * *